US010424605B2

(12) United States Patent
Hekmatshoartabari et al.

(10) Patent No.: US 10,424,605 B2
(45) Date of Patent: Sep. 24, 2019

(54) INTEGRATED GATE DRIVER

(71) Applicant: INTERNATIONAL BUSINESS MACHINES CORPORATION, Armonk, NY (US)

(72) Inventors: Bahman Hekmatshoartabari, White Plains, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 15/606,317

(22) Filed: May 26, 2017

(65) Prior Publication Data

US 2018/0076237 A1 Mar. 15, 2018

Related U.S. Application Data

(62) Division of application No. 15/266,414, filed on Sep. 15, 2016, now Pat. No. 9,748,281.

(51) Int. Cl.

*H01L 27/12* (2006.01)
*H01L 29/786* (2006.01)

(Continued)

(52) U.S. Cl.

CPC ........ *H01L 27/1251* (2013.01); *H01L 27/127* (2013.01); *H01L 27/1222* (2013.01);

(Continued)

(58) Field of Classification Search

CPC ............. H01L 27/1251; H01L 27/1222; H01L 27/127; H01L 29/0843; H01L 29/41783; H01L 29/4983; H01L 29/66431

See application file for complete search history.

(56) References Cited

U.S. PATENT DOCUMENTS 6,410,423 B1 * 6/2002 Anezaki ................ G03F 9/7076 257/E21.018
7,485,514 B2 * 2/2009 Winslow ............. H01L 29/1029 257/280

(Continued)

OTHER PUBLICATIONS

B. Hekmatshoar, "Thin-Film Heterojunction Field-Effect Transistors With Crystalline Si Channels and Low-Temperature PECVD Contacts", IEEE Electron Device Letters. vol. 35, No. 1. Jan. 2014. pp. 81-83.

(Continued)

*Primary Examiner* — Nathan W Ha

(74) *Attorney, Agent, or Firm* — Tutunjian & Bitetto, P.C.; Erik Johnson

(57) ABSTRACT

A method is presented for forming a semiconductor device. The method may include forming a first gate structure on a first portion of a semiconductor material located on a surface of an insulating substrate, the first gate structure including a first sacrificial layer and a second sacrificial layer and forming a second gate structure on a second portion of the semiconductor material located on the surface of the insulating substrate, the second gate structure including a third sacrificial layer. The method further includes etching the first and second dielectric sacrificial layers to create a first contact region within the first gate structure and etching the third dielectric sacrificial layer to create a second contact region within the second gate structure. The method further includes forming silicide in at least the first and second contact regions of the first and second gate structures, respectively.

20 Claims, 14 Drawing Sheets

156 154 140 154 156 152 150 130 150 152
122 124 110

(51) Int. Cl.

*H01L 29/49* (2006.01)
*H01L 29/417* (2006.01)
*H01L 29/66* (2006.01)
*H01L 29/80* (2006.01)
*H01L 29/08* (2006.01)
*H01L 29/10* (2006.01)

(52) U.S. Cl.

CPC ...... *H01L 27/1288* (2013.01); *H01L 29/0843* (2013.01); *H01L 29/41783* (2013.01); *H01L 29/4983* (2013.01); *H01L 29/66431* (2013.01); *H01L 29/78675* (2013.01); *H01L 29/802* (2013.01); *H01L 29/1066* (2013.01)

(56) References Cited

U.S. PATENT DOCUMENTS 9,093,548 B2 7/2015 Hekmatshoar-Tabari et al.
9,553,056 B1* 1/2017 Afzali-Ardakani .......................... H01L 23/576
2002/0068429 A1* 6/2002 Trivedi ............. H01L 21/28518 438/618
2003/0036233 A1* 2/2003 Chen ................. H01L 21/28518 438/261
2003/0042614 A1* 3/2003 Deraa ............... H01L 21/28518 257/768
2003/0049919 A1* 3/2003 Yamamoto ........ H01L 21/28052 438/592
2003/0148606 A1* 8/2003 Fortin ............... H01L 21/28518 438/655
2004/0058500 A1* 3/2004 Lee ..................... H01L 21/0206 438/299
2004/0142567 A1* 7/2004 Nakajima ......... H01L 21/28518 438/689
2006/0199324 A1* 9/2006 Yu ..................... H01L 21/28518 438/199
2007/0001233 A1* 1/2007 Schwan ............ H01L 21/28518 257/369
2007/0093047 A1* 4/2007 Okuno .............. H01L 21/28052 438/592
2009/0108379 A1* 4/2009 Oosuka ............. H01L 21/28525 257/412
2010/0078690 A1* 4/2010 Sugiyama ......... H01L 21/02164 257/288
2011/0024845 A1* 2/2011 Hirai ................. H01L 21/28079 257/369
2011/0266596 A1* 11/2011 Chen ................. H01L 21/26506 257/288
2012/0058614 A1* 3/2012 Nguyen .............. H01L 21/0206 438/264
2012/0115326 A1* 5/2012 Frohberg .......... H01L 21/28052 438/664
2012/0235244 A1* 9/2012 Yin ................. H01L 21/823807 257/368
2012/0241864 A1* 9/2012 Gerhardt ........... H01L 21/26586 257/368
2012/0313158 A1* 12/2012 Yin .................. H01L 21/28194 257/316
2012/0315760 A1* 12/2012 Yu ................... H01L 21/823807 438/682
2013/0015448 A1* 1/2013 Yang ................... H01L 27/0688 257/59
2013/0026470 A1* 1/2013 Terao ................ H01L 21/28518 257/52
2013/0029488 A1* 1/2013 Cai ................. H01L 21/823807 438/669
2013/0032877 A1* 2/2013 Ostermay ......... H01L 21/26586 257/329
2013/0049124 A1* 2/2013 Fitz ................. H01L 21/823425 257/368
2013/0052819 A1* 2/2013 Scheiper ........... H01L 21/28518 438/664
2013/0256901 A1* 10/2013 Scheiper ........... H01L 21/28518 257/774
2014/0048888 A1* 2/2014 Chen ................. H01L 21/02664 257/369
2015/0206947 A1* 7/2015 Hekmatshoartabari ...................... H01L 29/8086 257/66
2015/0279913 A1* 10/2015 Gates .................. H01L 27/3248 257/40
2016/0013287 A1* 1/2016 Yamamoto .......... H01L 29/4933 257/349
2016/0027814 A1* 1/2016 Jin ...................... H01L 27/1255 257/296
2016/0035857 A1* 2/2016 Leobandung ......... H01L 29/665 257/288
2016/0071799 A1* 3/2016 Hsieh .............. H01L 21/823871 257/288
2016/0233249 A1* 8/2016 Lu ....................... H01L 27/1222
2017/0077248 A1* 3/2017 Eom ................. H01L 29/41791

OTHER PUBLICATIONS

B. Heckmatshoar, Thin-Film Silicon Heterojunction FETs for Large Area and Flexible Electronics: Design Parameters and Reliability, IEEE Transactions on Electron Devices. vol. 62, No. 11, Nov. 2015. pp. 2524-2529.
List of IBM Patents or Patent Applications Treated as Related dated May 26, 2017, 2 pages.

* cited by examiner

3700

3800

INTEGRATED GATE DRIVER

BACKGROUND

Technical Field

The present invention relates generally to semiconductor devices, and more specifically, to an integrated gate driver formed by using a depletion-mode MOSFET (metal oxide semiconductor field effect transistor) and a HJFET (heterojunction field effect transistor).

Description of the Related Art

Low-cost large-area processing is highly desirable for applications in large-area electronics such as the fabrication of thin-film transistor (TFT) backplanes for active-matrix displays. However, large-area deposition techniques are typically suited for growing non-crystalline or poly-crystalline materials resulting in device performance which is inferior to that of single-crystalline materials. Processing single-crystalline devices typically requires a complementary metal oxide semiconductor (CMOS) foundry.

Hydrogenated amorphous silicon (a-Si:H) enjoys widespread use in the production of TFTs, image sensors, photoreceptors and solar cells. This material is typically grown by plasma-enhanced chemical vapor deposition (PECVD) at temperatures close to 200° C., suitable for low-cost, large-area substrates. Low-cost, large-area processing is highly desirable for applications in large-area electronics, such as the fabrication of TFT backplanes for active-matrix displays.

SUMMARY

In accordance with an embodiment, a method is provided for forming a semiconductor device. The method includes forming a first gate structure on a first portion of a semiconductor material located on a surface of an insulating substrate, the first gate structure including a first sacrificial layer and a second sacrificial layer. The method further includes forming a second gate structure on a second portion of the semiconductor material located on the surface of the insulating substrate, the second gate structure including a third sacrificial layer. The method further includes etching the first and second dielectric sacrificial layers to create a first contact region within the first gate structure, etching the third dielectric sacrificial layer to create a second contact region within the second gate structure, and forming silicide in at least the first and second contact regions of the first and second gate structures, respectively.

In accordance with an embodiment, a method is provided for forming a semiconductor device. The method includes forming a first gate structure on a first portion of a semiconductor material located on a surface of an insulating substrate, the first gate structure including a first dielectric sacrificial layer and a first metal layer. The method further includes forming a second gate structure on a second portion of the semiconductor material located on the surface of the insulating substrate, the second gate structure including a second dielectric sacrificial layer and a second metal layer. The method further includes forming silicide adjacent the first and second gate structures, etching the first dielectric sacrificial layer to expose the first metal layer above the first gate structure, and etching the second dielectric sacrificial layer to expose the second metal layer above the second gate structure.

In accordance with another embodiment, a semiconductor device, such as a heterojunction field effect transistor is provided. The heterojunction field effect transistor includes a semiconductor material located on a surface of an insulating substrate, a first gate structure formed on a portion of the semiconductor material, the first gate structure including a first dielectric sacrificial layer and a hydrogenated amorphous silicon layer, and a second gate structure formed on a portion of the semiconductor material, the second gate structure including a second dielectric sacrificial layer, a doped layer and an undoped layer. The first and second dielectric sacrificial layers of the first and second gate structures are etched to create first and second contact regions within the first and second gate structures, respectively, for receiving silicide.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

Throughout the drawings, same or similar reference numerals represent the same or similar elements.

DETAILED DESCRIPTION

Figure 1:
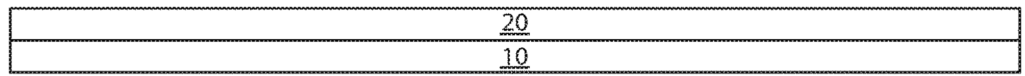
FIG. 1 is a cross-sectional view of an insulating substrate having a semiconductor material located thereon for forming an integrated depletion-mode MOSFET and HJFET semiconductor device, in accordance with an embodiment of the present disclosure.

Embodiments of the present disclosure relate generally to the formation of a semiconductor device. The formation includes forming a first gate structure on a first portion of a semiconductor material located on a surface of an insulating substrate, the first gate structure including a first sacrificial layer and a second sacrificial layer, forming a second gate structure on a second portion of the semiconductor material located on the surface of the insulating substrate, the second gate structure including a third sacrificial layer, etching the first and second dielectric sacrificial layers to create a first gap above the first gate structure, etching the third dielectric sacrificial layer to create a second gap above the second gate structure, and forming silicide in at least the first and second gaps of the first and second gate structures, respectively.

Moreover, embodiments of the present disclosure relate generally to a semiconductor device structure. The heterojunction field effect transistor includes a semiconductor material located on a surface of an insulating substrate, a first gate structure formed on a portion of the semiconductor material, the first gate structure including a first dielectric sacrificial layer and a hydrogenated amorphous silicon layer, and a second gate structure formed on a portion of the semiconductor material, the second gate structure including a second dielectric sacrificial layer, a doped layer and an undoped layer. The first and second dielectric sacrificial layers of the first and second gate structures are etched to create first and second gaps above the first and second gate structures, respectively, for receiving silicide.

In one or more embodiments, there is described (i) an integration scheme for the monolithic fabrication of an HJFET and a depletion-mode MOSFET without increasing the number of mask steps, (ii) a row (gate) driver circuit which may be implemented using the integration scheme, and (iii) an active matrix display with a row driver and an HJFET backplane where the row driver and the HJFET backplane are monolithically integrated.

In one or more embodiments, an active matrix organic light-emitting diode (AMOLED) display is implemented on a flexible plastic substrate, where (i) the TFT backplane is comprised of HJFET devices, thus providing a very high TFT stability required for driving the OLED despite the low temperature TFT process, (ii) the row driver is fabricated simultaneously with the backplane, and (iii) the column driver CMOS chip is attached to one side of the display panel.

In one or more embodiments, (i) the manufacturing cost and capital equipment cost is significantly reduced compared to the conventional LTPS process, (ii) the number of mask steps are reduced compared to a conventional LTPS process, (iii) the process temperature is reduced from 400-600° C. to, e.g., 200° C. and below, compared to conventional LTPS, (iv) the use of low cost and/or flexible substrates, such as plastic and conventional glass is made possible without compromising the device performance and system-level performance, and (v) device and system-level performance is enhanced (for a given power consumption), or the power consumption is reduced (for a given system performance), compared to the conventional LTPS process due to more advantageous HJFET device characteristics, such as a steep subthreshold slope.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure may be present between the first element and the second element.

The term "electrically connected" means either directly electrically connected, or indirectly electrically connected, such that intervening elements are present; in an indirect electrical connection, the intervening elements may include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/$cm^3$.

The term "intrinsic semiconductor," also called an undoped semiconductor or i-type semiconductor, is a pure semiconductor without any significant dopant species present. The number of charge carriers is therefore determined by the properties of the material itself instead of the amount of impurities. In intrinsic semiconductors, the number of excited electrons and the number of holes are equal (i.e., n=p).

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

The term "heterojunction" means any junction formed between two semiconductor materials having different band gaps, for example, c-Si/a-Si:H (contrasted with a junction formed between two semiconductors having the same band gap, such as c-Si/c-Si:H, known as a "homojunction").

As used herein, the term "dielectric" denotes a non-metallic material having a room temperature conductivity of less than about, e.g., $10^{-10}$ $(\Omega\text{-m})^{-1}$.

As used herein, the term "silicide" is an alloy of a metal and silicon.

It is to be understood that the present invention will be described in terms of a given illustrative architecture; however, other architectures, structures, substrate materials and process features and steps/blocks may be varied within the scope of the present invention. It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional view of an insulating substrate having a semiconductor material located thereon for forming an integrated depletion-mode MOSFET and HJFET semiconductor device is presented, in accordance with an embodiment of the present disclosure.

In one example, a semiconductor material 20 may be positioned directly over an insulating substrate or buried insulator 10. The semiconductor material 20 can be, e.g., an n-type Si semiconductor material. The semiconductor material 20 can be mono-crystalline or poly-crystalline. In one embodiment, the starting material is low-temperature poly-silicon (LTPS), but the process is applicable to other forms of poly-Si, mono-Si, or other semiconductors, such as mono/poly Ge, SiGe, III-V.

The insulating substrate 10 includes, but is not limited to, an oxide, a nitride, an oxynitride or a multilayered stack. In one embodiment, the insulating substrate 10 is comprised of a semiconductor oxide and/or a semiconductor nitride. An example of a semiconductor oxide that can be employed as the insulating substrate 10 includes silicon dioxide, while an example of a semiconductor nitride is silicon nitride. The thickness of the insulating substrate 10 can be from, e.g., 5 nm to 500 nm. Other thicknesses that are lesser than, or greater than, the aforementioned thickness range can also be employed as the thickness of the insulating substrate 10. In some embodiments, a handle substrate (not shown in the drawings) such as, for example, a semiconductor substrate, glass, plastic or metal foil can be located directly beneath the insulating substrate 10. In embodiments where the handle substrate is insulating, a separate insulating material is not needed since the insulating handle substrate can serve as the insulating substrate 10.

In one embodiment, the insulating substrate 10 is a component of a semiconductor-on-insulator (SOI) substrate. In this embodiment, the semiconductor material 20 of the first conductivity type can be the topmost semiconductor layer of the SOI substrate. In another embodiment, the insulating substrate 10 is formed on a surface of a handle substrate by deposition or a thermal growth technique and then an exposed surface of the insulating substrate 10 is bonded to a crystalline semiconductor layer (doped or non-doped), which can be used as the crystalline semiconductor material 20 of the first conductivity type.

In one embodiment, the semiconductor material 20 of the first conductivity type that can be employed can be an III-V compound semiconductor which includes at least one element from Group IIIA (i.e., Group 13) of the Periodic Table of Elements and at least one element from Group VA (i.e., Group 15) of the Periodic Table of Elements. The range of possible formulae for suitable III-V compound semiconductors that can be used is quite broad because these elements can form binary (two elements, e.g., gallium (III) arsenide (GaAs)), ternary (three elements, e.g., indium gallium arsenide (InGaAs)) and quaternary (four elements, e.g., aluminum gallium indium phosphide (AlInGaP)) alloys.

In another embodiment, the semiconductor material 20 of the first conductivity type can be a semiconductor material having the formula $Si_yGe_{1-y}$, wherein y is $0 \leq y \leq 1$. In some embodiments, in which y is 1, the semiconductor material 20 of the first conductivity type can be comprised entirely of Si. In another embodiment, in which y is 0, the crystalline semiconductor material 20 of the first conductivity type can be comprised entirely of Ge. In yet another embodiment and when y is other than 0 or 1, the semiconductor material 20 of the first conductivity type can be comprised entirely of a SiGe alloy.

In yet another embodiment, the semiconductor material 20 of the first conductivity type can be a semiconductor material comprised of SiC.

In some embodiments, the semiconductor material 20 may include nitrogen, oxygen, fluorine, deuterium, chlorine or any combination thereof. When present, the concentration of the aforementioned species can be, e.g., from 1 atomic % to 10 atomic percent. Other concentrations that are lesser than, or greater than, the aforementioned concentration range can also be present.

The first conductivity type of the semiconductor material 20 of the present disclosure can be either p-type or n-type. As used herein, "p-type" refers to the addition of impurities to an intrinsic semiconductor that creates deficiencies of valence electrons (i.e., holes). In a Si-containing semiconductor material, examples of p-type dopants, i.e., impurities, include but are not limited to, boron, aluminum, gallium and indium. In one embodiment, in which the first conductivity type of the semiconductor material 20 of the present disclosure is p-type, the p-type dopant is present in a concentration ranging from, e.g., $1\times10^{9}$ atoms/cm$^3$ to $1\times10^{20}$ atoms/cm$^3$. In another embodiment, in which the first conductivity type of the semiconductor material 20 of the present disclosure is p-type, the p-type dopant is present in a concentration ranging from, e.g., $1\times10^{14}$ atoms/cm$^3$ to $1\times10^{19}$ atoms/cm$^3$. As used herein, "n-type" refers to the addition of impurities that contributes free electrons to an intrinsic semiconductor. In a Si-containing semiconductor, examples of n-type dopants, i.e., impurities, include but are not limited to, antimony, arsenic and phosphorous. In one embodiment, in which the first conductivity type of the semiconductor material 20 of the present disclosure is n-type, the n-type dopant is present in a concentration ranging from, e.g., $1\times10^{9}$ atoms/cm$^3$ to $1\times10^{20}$ atoms/cm$^3$. In another embodiment, in which the first conductivity type of the semiconductor material 20 of the present disclosure is n-type, the n-type dopant is present in a concentration ranging from, e.g., $1\times10^{14}$ atoms/cm$^3$ to $1\times10^{19}$ atoms/cm$^3$.

The dopant concentration that provides the first conductivity type within the semiconductor material 20 may be graded or uniform. By "uniform" it is meant that the dopant concentration is the same throughout the entire thickness of the semiconductor material 20. For example, a semiconductor material 20 of the first conductivity type having a uniform dopant concentration may have the same dopant concentration at the upper surface and bottom surface of the semiconductor material, as well as the same dopant concentration at a central portion of the semiconductor material between the upper surface and the bottom surface of the semiconductor material 20 of the first conductivity type. By "graded" it is meant that the dopant concentration varies throughout the thickness of the semiconductor material 20 of the first conductivity type. For example, a semiconductor material 20 of the first conductivity type having a graded dopant concentration may have an upper surface with a greater dopant concentration than the bottom surface of the a semiconductor material 20 of the first conductivity type, and vice versa.

The first conductivity type can be introduced during the growth of the semiconductor material 20. Alternatively, the first conductivity type can be introduced into an intrinsic crystalline semiconductor material by utilizing ion implantation, and/or gas phase doping and the doped crystalline semiconductor material can be employed as the semiconductor material 20 of the first conductivity type.

The thickness of the semiconductor material 20 of the first conductivity type can be from, e.g., 3 nm to 3 μm. Other thicknesses that are lesser than, or greater than, the aforementioned thickness range can also be employed for the thickness of the semiconductor material 20 of the first conductivity type.

Figure 2:
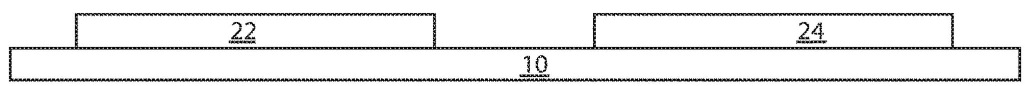
FIG. 2 is a cross-sectional view of the semiconductor device of FIG. 1 where the semiconductor material has been modified by photo-masking, in accordance with an embodiment of the present disclosure.

FIG. 2 is a cross-sectional view of the semiconductor device of FIG. 1 where the semiconductor material has been modified by photo-masking, in accordance with an embodiment of the present disclosure.

The semiconductor material 20 can be split or divided into two portions or sections, e.g., a first semiconductor material section 22 and a second semiconductor material section 24. The first and second semiconductor material sections 22, 24 can be formed by, e.g., photo-masking. Masking is used to protect one area of the insulating substrate 10 while working on another. This process is referred to as photolithography or photo-masking. A photoresist or light-sensitive film is applied to the insulating substrate 10, giving it characteristics similar to a piece of photographic paper. A photo aligner aligns the insulating substrate 10 to a mask and then projects an intense light through the mask and through a series of reducing lenses, exposing the photoresist with the mask pattern. In the instant case, a photo-mask (not shown) can create first and second semiconductor material sections 22, 24 on the insulating substrate 10. The first and second semiconductor material sections 22, 24 can be, e.g., n-type materials.

Figure 3:
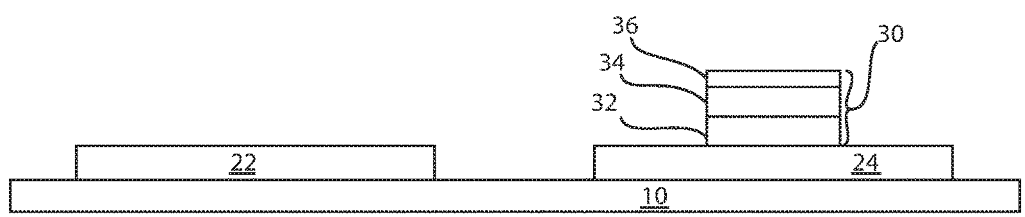
FIG. 3 is a cross-sectional view of the semiconductor device of FIG. 2 where a MOSFET gate structure is formed on a portion of the semiconductor material, in accordance with an embodiment of the present disclosure.

FIG. 3 is a cross-sectional view of the semiconductor device of FIG. 2 where a MOSFET gate structure is formed on a portion of the semiconductor material, in accordance with an embodiment of the present disclosure.

Figure 8:
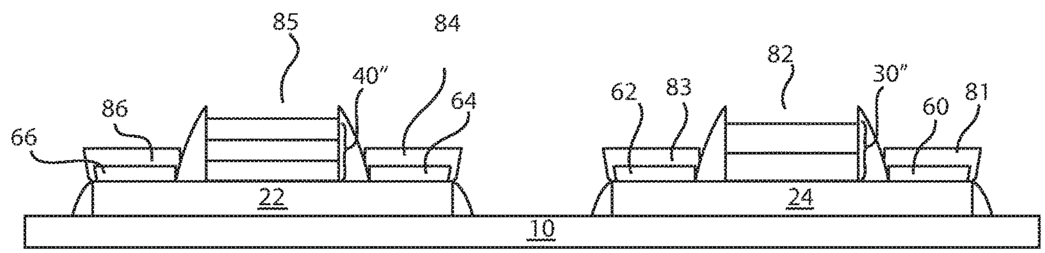
FIG. 8 is a cross-sectional view of the semiconductor device of FIG. 7 where silicide is formed on the depletion-mode MOSFET gate structure and the HJFET gate structure, in accordance with an embodiment of the present disclosure.

A depletion-mode MOSFET gate structure 30 is formed on the second semiconductor material section 24. The MOSFET gate structure 30 includes a dielectric layer 32, a hydrogenated amorphous silicon (a-Si:H) layer 34, which is a sacrificial layer, and a sacrificial dielectric layer 36. The sacrificial a-Si:H layer 34 in the MOSFET gate stack 30 (used for silicide formation) may be doped, but undoped material may also be used as well, in which case the undoped material is, e.g., thin enough to be entirely consumed during silicide formation (FIG. 8).

Figure 4:
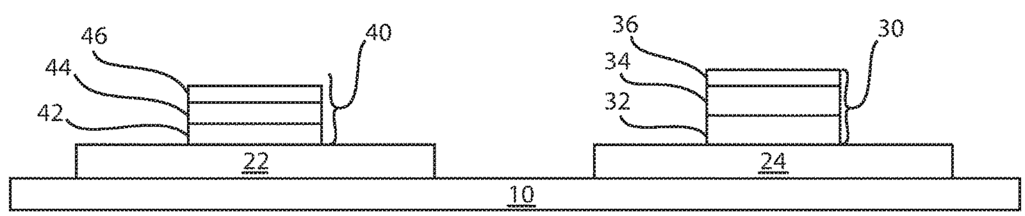
FIG. 4 is a cross-sectional view of the semiconductor device of FIG. 3 where a HJFET gate structure is formed on a portion of the semiconductor material, in accordance with an embodiment of the present disclosure.

FIG. 4 is a cross-sectional view of a semiconductor device of FIG. 3 where a HJFET gate structure is formed on a portion of the semiconductor material, in accordance with an embodiment of the present disclosure.

A HJFET gate structure 40 is formed on the first semiconductor material section 22. The HJFET gate structure 40 includes an intrinsic a-Si:H layer 42, a doped a-Si:H layer 44, and a sacrificial dielectric layer 46. The doped a-Si:H layer 44 may be, e.g., a p-type doped layer. The dopant type of the doped a-Si:H layer 44 may be opposite the dopant type of the first semiconductor material section 22.

Figure 5:
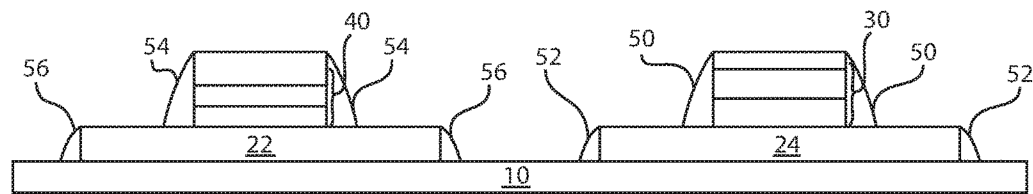
FIG. 5 is a cross-sectional view of the semiconductor device of FIG. 4 after spacer formation, in accordance with an embodiment of the present disclosure.

FIG. 5 is a cross-sectional view of a semiconductor device of FIG. 4 after spacer formation, in accordance with an embodiment of the present disclosure.

After spacer formation, the MOSFET gate structure 30 has spacer sidewalls 50 and the second semiconductor material 24 has spacer sidewalls 52. The HJFET gate structure 40 has spacer sidewalls 54 and the first semiconductor material 22 has spacer sidewalls 56. Spacer patterning is a technique employed for patterning features with linewidths smaller than can be achieved by conventional lithography. In the most general sense, the spacer is a layer that is deposited over a pre-patterned feature, often called the mandrel. The spacer is subsequently etched back so that the spacer portion covering the mandrel is etched away while the spacer portion on the sidewall remains. The mandrel may then be removed, leaving two spacers (one for each edge) for each mandrel, as shown in FIG. 5.

The spacer material is chosen to have a much lower etch rate in a wet chemical solution, such as buffer HF, than the sacrificial top dielectric layers 36, 46 used in the MOSFET and HJFET gate stacks 30, 40, respectively. In one example, the spacer is comprised of a high-k dielectric formed by atomic layer deposition, whereas the sacrificial dielectrics 36, 46 are comprised of high-OH oxide deposited by PECVD at low plasma power density. Plasma-enhanced chemical vapor deposition (PECVD) is a process used to deposit thin films from a gas state (vapor) to a solid state on a substrate. Chemical reactions are involved in the process, which occur after creation of a plasma of the reacting gases. PECVD may also be employed for low-temperature deposition of amorphous, microcrystalline, polycrystalline, as well as epitaxial growth of silicon on a c-Si substrate.

Figure 6:
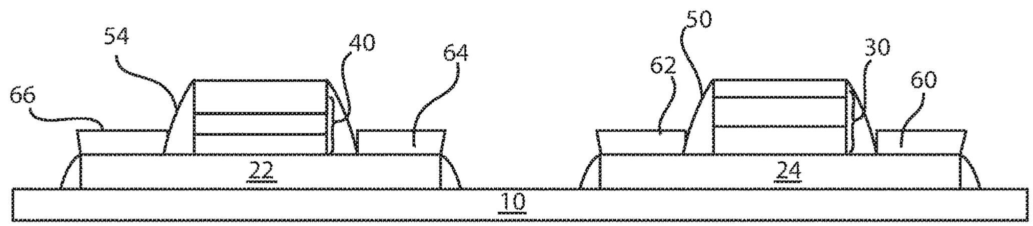
FIG. 6 is a cross-sectional view of the semiconductor device of FIG. 5 where crystalline hydrogenated silicon has been grown on the semiconductor material, in accordance with an embodiment of the present disclosure.

FIG. 6 is a cross-sectional view of a semiconductor device of FIG. 5 where crystalline hydrogenated silicon has been grown on the semiconductor material, in accordance with an embodiment of the present disclosure.

Hydrogenated silicon (Si:H) can be grown by PECVD from a mixture of precursor gas SiH4 (or other gases of the $Si_xH_y$ family), carrier gas $H_2$ and dopant gas, such that $[H_2]/[SiH_4]>5$. In some embodiments, hot-wire chemical vapor deposition (HWCVD) may be used instead of PECVD. For n-type doping, the dopant gas may include $PH_3$. For p-type doping, the dopant gas may include $B_2H_6$ or TMB. The c-Si:H has H content in the range of, e.g., 5-40 atomic percent. The H content in c-Si:H may or may not be uniform. In some embodiments, the H content has a gradient towards the c-Si:H/LTPS interface.

In some embodiments, the Si:H may further contain one or more of the following elements: D, F, Cl, C, Ge, O, N. In one embodiment, the a-Si:H is etched selectively with respect to c-Si:H in the range of, e.g., 3:1-10:1. In another embodiment, selectivity >10:1. In one embodiment, selective etch is performed in H plasma. In another embodiment, a wet etch such as dilute KOH (~1M or below) or dilute HF (<5% is DI water) is used.

After hydrogenated silicon (Si:H) is grown and selective etching is performed of the $n^+$ hydrogenated amorphous silicon (a-Si:H), $n^+$ hydrogenated crystalline silicon (c-Si:H) is left behind. The MOSFET gate structure 30 includes a first layer 60 and a second layer 62 on opposed sides thereof. The first layer 60 may be an $n^+$ c-Si:H layer. The second layer may be an $n^+$ c-Si:H layer. The HJFET gate structure 40 further includes a first layer 64 and a second layer 66 on opposed sides thereof. The first layer 60 may be an $n^+$ c-Si:H layer. The second layer may be an $n^+$ c-Si:H layer. The first $n^+$ c-Si:H layer 60 and the second $n^+$ c-Si:H layer 62 rest on the second semiconductor material section 24, whereas the first $n^+$ c-Si:H layer 64 and the second $n^+$ c-Si:H layer 66 rest on the first semiconductor material section 22. The first $n^+$ c-Si:H layer 60 and the second $n^+$ c-Si:H layer 62 are formed adjacent the spacer sidewalls 50 of the MOSFET gate structure 30. The first $n^+$ c-Si:H layer 64 and the second $n^+$ c-Si:H layer 66 are formed adjacent the spacer sidewalls 54 of the HJFET gate structure 40.

Figure 7:
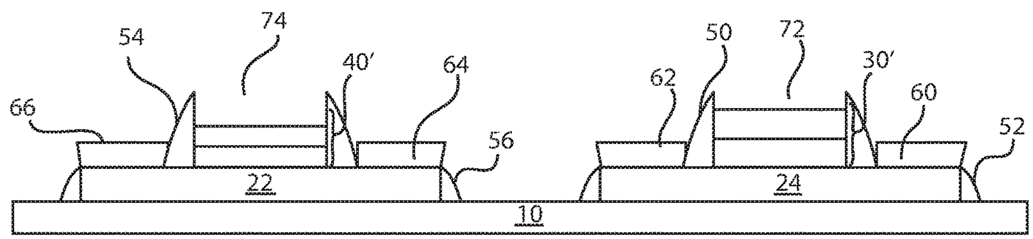
FIG. 7 is a cross-sectional view of the semiconductor device of FIG. 6 where sacrificial dielectrics are removed by etching, in accordance with an embodiment of the present disclosure.

FIG. 7 is a cross-sectional view of a semiconductor device of FIG. 6 where sacrificial dielectrics are removed by etching, in accordance with an embodiment of the present disclosure.

The sacrificial dielectric layer 36 of the MOSFET gate structure 30 is etched, such that the top surface of the a-Si:H layer 34 is exposed. In embodiments where the etch rate of the spacer material is significantly lower or negligible compared to that of the sacrificial dielectric material, the topmost surface of the spacer lies above the top surface of the a-Si:H layer 34 after the etch, thus creating a gap region 72 over the remaining gate structure 30', as illustrated in FIG. 7. However, in embodiments with relatively higher etch rate, the topmost surface of the spacer may lie at about the same height or slightly lower than that of the top surface of the a-Si:H layer 34 (not illustrated). The spacers 50 are effective in laterally separating the gate region from the source/drain regions with or without the presence of a gap region, therefore while the gap region 72 is likely to form in a preferred embodiment, it is not a required feature of the disclosed embodiment. Similarly, the sacrificial dielectric layer 46 of the HJFET gate structure 40 is etched to expose the top surface of the a-Si:H layer 44. This may create a gap region 74 over the remaining gate structure 40'.

FIG. 8 is a cross-sectional view of a semiconductor device of FIG. 7 where silicide is formed on the depletion-mode MOSFET gate structure and the HJFET gate structure, in accordance with an embodiment of the present disclosure.

The a-Si:H layer 34 of the MOSFET gate structure 30 is consumed as silicide is formed over the MOSFET gate structure 30 and the HJFET gate structure 40. The a-Si:H layer 34 may be consumed entirely, as illustrated in the embodiment of FIG. 7, or may be partially consumed partially in other embodiments. The MOSFET gate structure has, e.g., three layers of silicide 81, 82, 83. The first silicide layer 81 is formed over the $n^+$ c-Si:H layer 60, the second silicide layer 82 is formed on the dielectric layer 32 and the third silicide layer 83 is formed on the $n^+$ c-Si:H layer 62. The HJFET gate structure 40 also has, e.g., three layers of silicide 84, 85, 86. The first silicide layer 84 is formed over the $n^+$ c-Si:H layer 64, the second silicide layer 85 is formed on the p-type a-Si:H layer 44 and the third silicide layer 86 is formed on the $n^+$ c-Si:H layer 66.

The silicide formation process is comprised of 3 steps, (i) deposition of a metal layer, (ii) annealing to form silicide material as a result of chemical reaction between metal and a-Si:H (e.g., for the gate regions of the HJFET and MOSFET in FIG. 7), and between metal and c-Si:H (e.g., for the source/drain regions on the HJFET and MOSFET in FIG. 7), and (iii) chemical wet etching to remove the un-reacted (un-silicidized) portion of the metal selective to the silicide. Note the entire portion of the metal layer deposited on the dielectric surfaces (i.e., the spacers 50, 54, 52, 56, and the substrate 10) is not silicidized and therefore etched away during step (iii).

Thus, the MOSFET has a gate structure 30" after silicide formation and the HJFET has a gate structure 40" after silicide formation.

In some embodiments, silicide may form automatically during the deposition of the metal. In such embodiments, the silicide formation may be assisted by raising the substrate temperature above the room temperature. In one example, the substrate temperature is 150° C.

In some embodiments, silicide is formed after the metal deposition by annealing at moderate temperatures. In such embodiments, the annealing time and temperature are kept low enough to avoid out-diffusion of hydrogen from c-Si:H and therefore formation of defects that would compromise active doping. In one example, annealing is performed at, e.g., 150° C. for ½ hour. In another example, annealing is performed at, e.g., 200° C. for 1 minute. In yet another example, annealing is performed at, e.g., 300° C. for 10 seconds.

In some embodiments, silicide formation requires depositing a refractory metal such as Ni or Ti onto the surface of a Si-containing material or wafer. Following deposition, the structure is then subjected to an annealing step using conventional processes such as, but not limited to, rapid thermal annealing. During thermal annealing, the deposited metal reacts with Si forming a metal silicide.

In the semiconductor device process formation described in FIGS. 1-8, only three (3) number of masks are necessary, no ion-implantations are necessary, and the maximum process temperature is, e.g., 100-200° C. Moreover, the semiconductor device process formation described in FIGS. 1-8 illustrate the integration of depletion mode MOSFETs and HJFETs. Thus, gate driver circuitry may be developed with small standby power for the HJFET backplane (e.g., for driving a pixel circuit) without increasing the number of masks or process complication. The depletion-mode MOSFETs may be primarily used in the gate driver, but if desired may be used in the backplane as well (e.g., as switching TFTs which do not require high stability).

Figure 9:
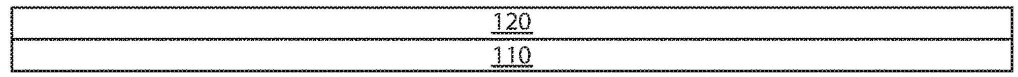
FIG. 9 is a cross-sectional view of an insulating substrate having a semiconductor material located thereon for forming an integrated depletion-mode MOSFET and HJFET semiconductor device, in accordance with an embodiment of the present disclosure.

FIG. 9 is a cross-sectional view of an insulating substrate having a semiconductor material located thereon for forming an integrated depletion-mode MOSFET and HJFET semiconductor device, in accordance with an embodiment of the present disclosure.

In one example, semiconductor material 120 can be positioned directly over an insulating substrate or buried insulator 110. The semiconductor material 120 can be, e.g., an n-type Si semiconductor material layer. The semiconductor material 120 can be mono-crystalline or poly-crystalline. In one embodiment, the starting material is low-temperature poly-silicon (LTPS), but the process is applicable to other forms of poly-Si, mono-Si, or other semiconductors, such as mono/poly Ge, SiGe, III-V.

Figure 10:
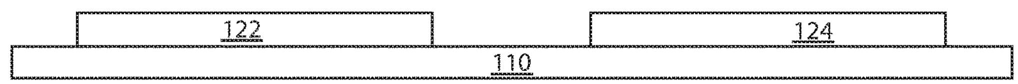
FIG. 10 is a cross-sectional view of the semiconductor device of FIG. 9 where the semiconductor material has been modified by photo-masking, in accordance with an embodiment of the present disclosure.

FIG. 10 is a cross-sectional view of the semiconductor device of FIG. 9 where the semiconductor material has been modified by photo-masking, in accordance with an embodiment of the present disclosure.

The semiconductor material 120 can be split or divided into two portions or sections, a first semiconductor material section 122 and a second semiconductor material section 124. The first and second semiconductor material sections 122, 124 can be formed by, e.g., photo-masking. This process was described above with reference to FIG. 2. In the instant case, a photo-mask (not shown) may create first and second semiconductor material sections 122, 124 on the insulating substrate 110. The first and second semiconductor material sections 122, 124 can be, e.g., n-type materials.

Figure 11:
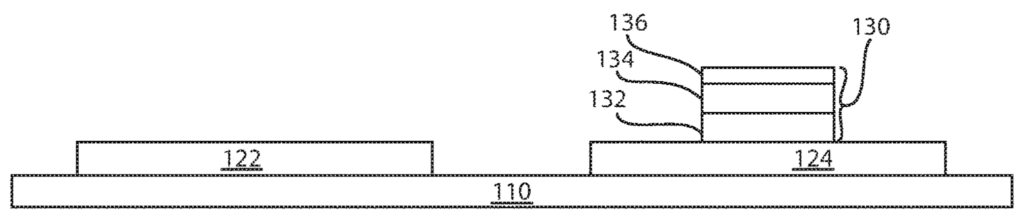
FIG. 11 is a cross-sectional view of the semiconductor device of FIG. 10 where a MOSFET gate structure is formed on a portion of the semiconductor material, the MOSFET gate structure including a metal layer, in accordance with an embodiment of the present disclosure.

FIG. 11 is a cross-sectional view of the semiconductor device of FIG. 10 where a MOSFET gate structure is formed on a portion of the semiconductor material, the MOSFET gate structure including a metal layer, in accordance with an embodiment of the present disclosure.

A depletion-mode MOSFET gate structure 130 is formed on the second semiconductor material section 124. The MOSFET gate structure 130 includes a dielectric layer 132, a metal layer 134, and a sacrificial dielectric layer 136.

Figure 12:
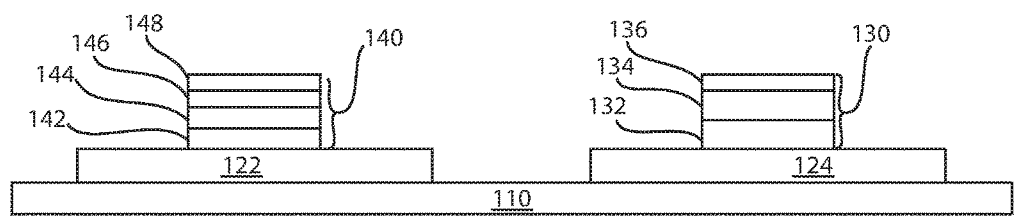
FIG. 12 is a cross-sectional view of the semiconductor device of FIG. 11 where a HJFET gate structure is formed on a portion of the semiconductor material, the HJFET gate structure including a metal layer, in accordance with an embodiment of the present disclosure.

FIG. 12 is a cross-sectional view of a semiconductor device of FIG. 11 where a HJFET gate structure is formed on a portion of the semiconductor material, the HJFET gate structure including a metal layer, in accordance with an embodiment of the present disclosure.

A HJFET gate structure 140 is formed on the first semiconductor material section 122. The HJFET gate structure 140 includes an intrinsic a-Si:H layer 142, a doped a-Si:H layer 144, a metal layer 146, and a sacrificial dielectric layer 148. The doped a-Si:H layer 144 can be, e.g., a p-type doped layer. The dopant type of the doped a-Si:H layer 144 may be opposite the dopant type of the first semiconductor material section 122. Thus, both a HJFET gate structure and a MOSFET gate structure are formed on a single insulating substrate 110.

Figure 13:
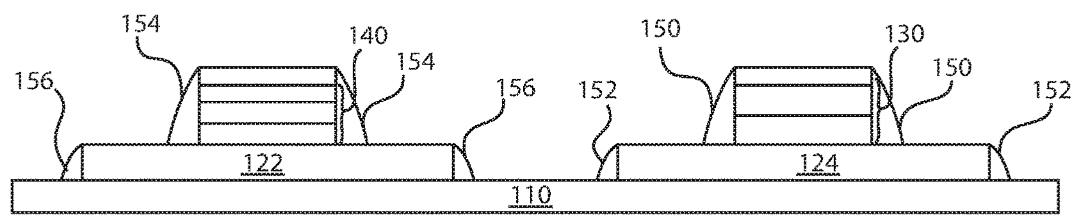
FIG. 13 is a cross-sectional view of the semiconductor device of FIG. 12 after spacer formation, in accordance with an embodiment of the present disclosure.

FIG. 13 is a cross-sectional view of a semiconductor device of FIG. 12 after spacer formation, in accordance with an embodiment of the present disclosure.

After spacer formation, the MOSFET gate structure 130 has spacer sidewalls 150 and the second semiconductor material 124 has spacer sidewalls 152. The HJFET gate structure 140 has spacer sidewalls 154 and the first semiconductor material 122 has spacer sidewalls 156. The spacer material is chosen to have a much lower etch rate in a wet chemical solution, such as buffer HF, than the sacrificial top dielectric layers 136, 148 used in the MOSFET and HJFET gate stacks 130, 140, respectively. In one example, the spacer is comprised of a high-k dielectric formed by atomic layer deposition whereas the sacrificial dielectrics 136, 148 are comprised of high-OH oxide deposited by PECVD at low plasma power density.

Figure 14:
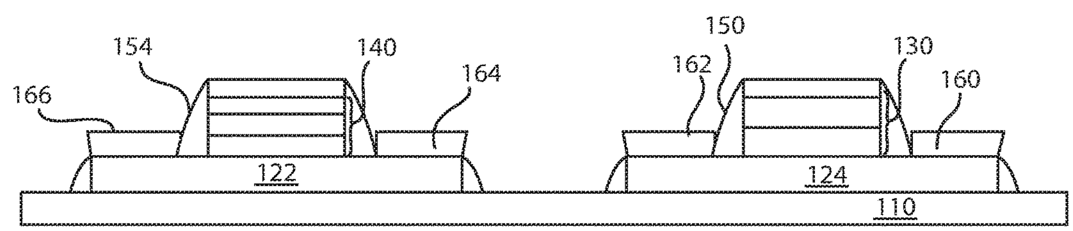
FIG. 14 is a cross-sectional view of the semiconductor device of FIG. 13 where crystalline hydrogenated silicon has been grown on the semiconductor material, in accordance with an embodiment of the present disclosure.

FIG. 14 is a cross-sectional view of a semiconductor device of FIG. 13 where crystalline hydrogenated silicon has been grown on the semiconductor material, in accordance with an embodiment of the present disclosure.

Hydrogenated silicon (Si:H) can be grown by PECVD from a mixture of precursor gas SiH4 (or other gases of the $Si_xH_y$ family), carrier gas $H_2$ and dopant gas, such that $[H_2]/[SiH_4]>5$. In some embodiments, hot-wire chemical vapor deposition (HWCVD) can be used instead of PECVD. For n-type doping, the dopant gas can include $PH_3$. For p-type doping, the dopant gas can include $B_2H_6$ or TMB. The c-Si:H has H content in the range of, e.g., 5-40 atomic percent. The H content in c-Si:H may or may not be uniform. In some embodiments, the H content has a gradient towards the c-Si:H/LTPS interface.

In some embodiments, the Si:H may further contain one or more of the following elements: D, F, Cl, C, Ge, O, N. In one embodiment, the a-Si:H is etched selectively with respect to c-Si:H in the range of, e.g., 3:1-10:1. In another embodiment, selectivity >10:1. In one embodiment, selective etch is performed in H plasma. In another embodiment a wet etch such as dilute KOH (~1M or below) or dilute HF (<5% is DI water) is used.

After hydrogenated silicon (Si:H) is grown and selective etching is performed of the $n^+$ a-Si:H, $n^+$ c-Si:H is left behind. The MOSFET gate structure 130 includes a first layer 160 and a second layer 162 on opposed sides thereof. The first layer can be an $n^+$ c-Si:H layer. The second layer can be an $n^+$ c-Si:H layer. The HJFET gate structure 140 further includes a first layer 164 and a second layer 166 on opposed sides thereof. The first layer can be an $n^+$ c-Si:H layer. The second layer can be an $n^+$ c-Si:H layer. The first $n^+$ c-Si:H layer 160 and the second $n^+$ c-Si:H layer 162 rest on the second semiconductor material section 124, whereas the first $n^+$ c-Si:H layer 164 and the second $n^+$ c-Si:H layer 166 rest on the first semiconductor material section 122. The first $n^+$ c-Si:H layer 160 and the second $n^+$ c-Si:H layer 162 are formed adjacent the spacer sidewalls 150 of the MOSFET gate structure 130. The first $n^+$ c-Si:H layer 164 and the second $n^+$ c-Si:H layer 166 are formed adjacent the spacer sidewalls 154 of the HJFET gate structure 140.

Figure 15:
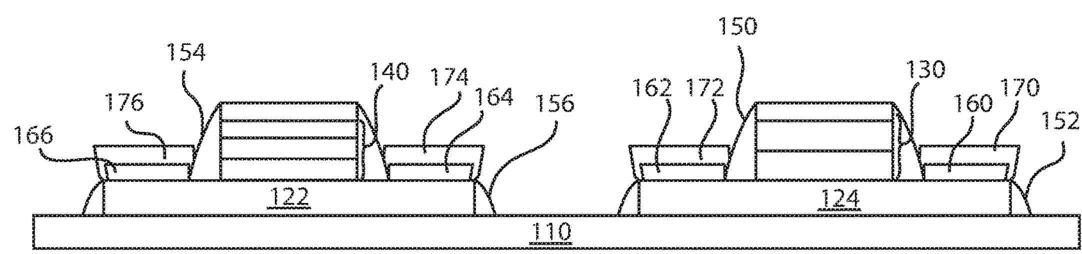
FIG. 15 is a cross-sectional view of the semiconductor device of FIG. 14 where silicide is formed on the depletion-mode MOSFET gate structure and the HJFET gate structure, in accordance with an embodiment of the present disclosure.

FIG. 15 is a cross-sectional view of a semiconductor device of FIG. 14 where silicide is formed on the depletion-mode MOSFET gate structure and the HJFET gate structure, in accordance with an embodiment of the present disclosure.

Silicide is applied to the MOSFET and HJFET structures. The MOSFET gate structure 130 has, e.g., two layers of silicide 170, 172. The first silicide layer 170 is formed over the $n^+$ c-Si:H layer 160 and the second silicide layer 172 is formed over the $n^+$ c-Si:H layer 162. The HJFET gate structure 140 also has, e.g., two layers of silicide 174, 176. The first silicide layer 174 is formed over the $n^+$ c-Si:H layer 164 and the second silicide layer 176 is formed over the $n^+$ c-Si:H layer 166. It is noted that no silicide is formed over the sacrificial dielectric layers 136, 148 of the MOSFET and HJFET gate structure, respectively. The silicide formation process comprises of 3 steps as described with respect to the embodiment of FIG. 7.

Figure 16:
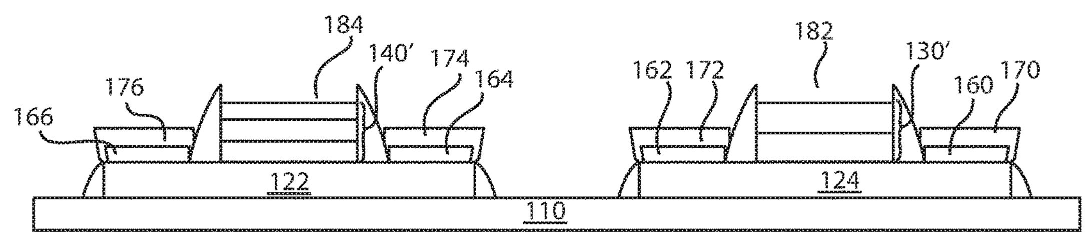
FIG. 16 is a cross-sectional view of the semiconductor device of FIG. 15 where sacrificial dielectrics are removed by etching to expose the metal layers of the depletion-mode MOSFET and the HJFET gate structures, in accordance with an embodiment of the present disclosure.

FIG. 16 is a cross-sectional view of a semiconductor device of FIG. 15 where sacrificial dielectrics are removed by etching to expose the metal layers of the depletion-mode MOSFET and the HJFET gate structures, in accordance with an embodiment of the present disclosure.

The sacrificial dielectric layer 136 of the MOSFET gate structure 130 is etched. This may create a gap region 182 over the remaining gate structure 130'. Moreover, the sacrificial dielectric layer 148 of the HJFET gate structure 140 is etched. This may create a gap region 184 over the remaining gate structure 140'.

In the semiconductor device process formation described in FIGS. 9-16, only three (3) number of masks are necessary, no ion-implantations are necessary, and the maximum process temperature is, e.g., 100-200° C. Moreover, the semiconductor device process formation described in FIGS. 9-16 illustrate the integration of depletion mode MOSFETs and HJFETs, where at least one layer of each of the gate structures includes a metal layer.

Figure 17:
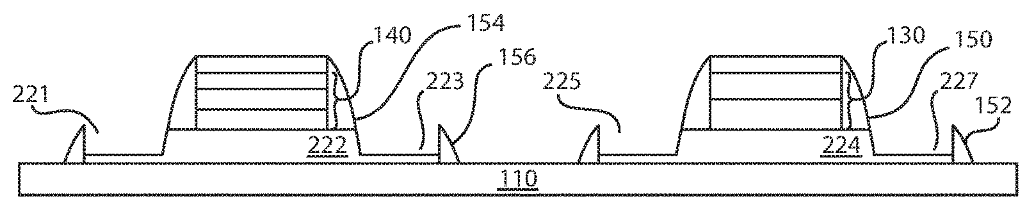
FIG. 17 is a cross-sectional view of the semiconductor device of FIG. 13 where partial etching of the insulating substrate forms gap regions thereon, in accordance with an embodiment of the present disclosure.

FIG. 17 is a cross-sectional view of a semiconductor device of FIG. 13 where partial etching of the insulating substrate forms gap regions thereon, in accordance with an embodiment of the present disclosure.

In contrast to FIGS. 13-16 above, in FIGS. 17-20 the Si substrate sections 222, 224 are partially etched after the spacer formation. Various dry or wet Si etch chemistries selective to dielectrics can be used. The first few steps of this process are the same as process steps illustrated in FIGS. 9-12 and will be omitted.

In FIG. 17, the Si substrate 224 of the MOSFET gate structure 130 has been etched to create a first gap region 225 and a second gap region 227. Similarly, the Si substrate 222 of the HJFET gate structure 140 has been etched to create a first gap region 221 and a second gap region 223.

Figure 18:
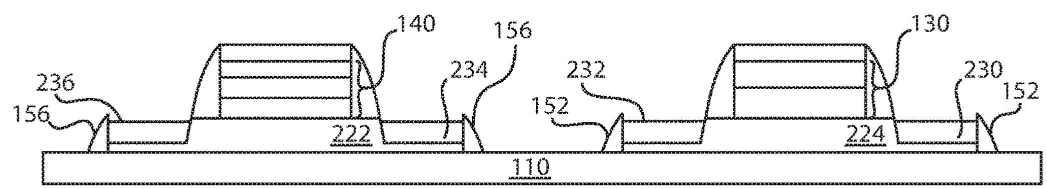
FIG. 18 is a cross-sectional view of the semiconductor device of FIG. 17 where crystalline hydrogenated silicon has been grown in the gap regions of the insulating substrate, in accordance with an embodiment of the present disclosure.

FIG. 18 is a cross-sectional view of a semiconductor device of FIG. 17 where crystalline hydrogenated silicon has been grown in the gap regions of the insulating substrate, in accordance with an embodiment of the present disclosure.

Hydrogenated silicon (Si:H) is grown in the gap regions of the MOSFET and HJFET gate structures. In one instance, after Si:H is grown and selective etching is performed of the $n^+$ a-Si:H, $n^+$ c-Si:H is left behind. The MOSFET gate structure 130 includes a first layer 230 and a second layer 232 on opposed sides thereof. The first and second layers can be $n^+$ c-Si:H layers. The first $n^+$ c-Si:H 230 layer is formed within the gap region 227 and the second $n^+$ c-Si:H 232 layer is formed within the gap region 225. The HJFET gate structure 140 further includes a first layer 234 and a second layer 236 on opposed sides thereof. The first and second layers can be $n^+$ c-Si:H layers. The first $n^+$ c-Si:H 234 layer is formed within the gap region 223 and the second $n^+$ c-Si:H 236 layer is formed within the gap region 221. The first $n^+$ c-Si:H layer 230 and the second $n^+$ c-Si:H layer 232 are formed adjacent the spacer sidewalls 152 of the MOSFET gate structure 130. The first $n^+$ c-Si:H layer 234 and the second $n^+$ c-Si:H layer 236 are formed adjacent the spacer sidewalls 156 of the HJFET gate structure 140.

Figure 19:
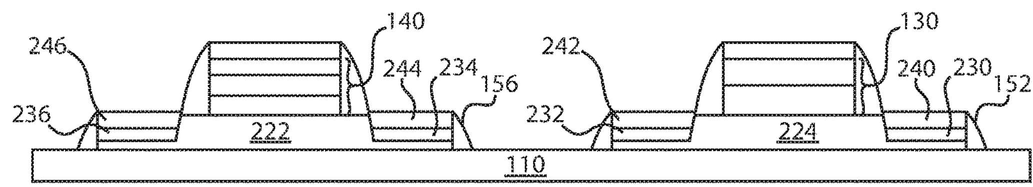
FIG. 19 is a cross-sectional view of the semiconductor device of FIG. 18 where silicide is formed on the depletion-mode MOSFET gate structure and the HJFET gate structure, in accordance with an embodiment of the present disclosure.

FIG. 19 is a cross-sectional view of a semiconductor device of FIG. 18 where silicide is formed on the depletion-mode MOSFET gate structure and the HJFET gate structure, in accordance with an embodiment of the present disclosure.

Silicide is applied to the MOSFET and HJFET structures. The MOSFET gate structure 130 has, e.g., two layers of silicide 240, 242, The first silicide layer 240 is formed over the c-Si:H layer 230 and the second silicide layer 242 is formed over the c-Si:H layer 232. The first silicide layer 240 is positioned within the gap region 227 and the second silicide layer 242 is positioned within the gap region 225.

The HJFET gate structure 140 also has, e.g., two layers of silicide 244, 246. The first silicide layer 244 is formed over the c-Si:H layer 234 and the second silicide layer 246 is formed on the c-Si:H layer 236. The first silicide layer 244 is positioned within the gap region 223 and the second silicide layer 246 is positioned within the gap region 221. The first and second silicide layers 240, 242 are thus positioned adjacent the spacer sidewalls 152 of the MOSFET gate structure 130. Similarly, the first and second silicide layer 244, 246 are thus positioned adjacent the spacer sidewalls 156 of the HJFET gate structure 140.

It is noted that no silicide is formed over the sacrificial dielectric layers 136, 148 of the MOSFET and HJFET gate structure, respectively. In one embodiment, the thickness of the silicide layer 240 and the c-Si:H layer 230 may be substantially equal to the thickness of the Si substrate section 224 of the MOSFET gate structure 130. Similarly, in one embodiment, the thickness of the silicide layer 240 and the c-Si:H layer 234 may be substantially equal to the thickness of the Si substrate section 222 of the HJFET structure 140.

Figure 20:
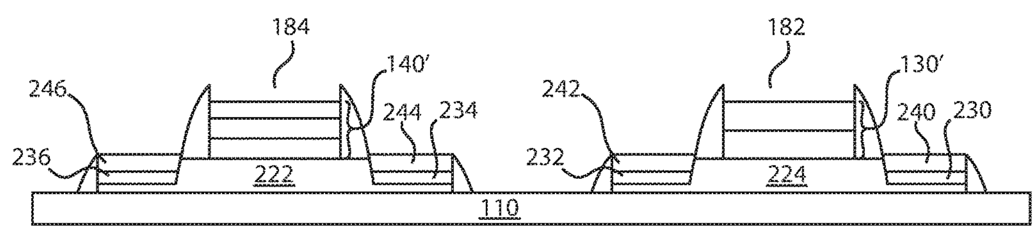
FIG. 20 is a cross-sectional view of the semiconductor device of FIG. 19 where sacrificial dielectrics are removed by etching to expose the metal layers of the depletion-mode MOSFET and the HJFET gate structures, in accordance with an embodiment of the present disclosure.

FIG. 20 is a cross-sectional view of a semiconductor device of FIG. 19 where sacrificial dielectrics are removed by etching to expose the metal layers of the depletion-mode MOSFET and the HJFET gate structures, in accordance with an embodiment of the present disclosure.

The sacrificial dielectric layer 136 of the MOSFET gate structure 130 is etched. This may create a gap region 182 over the remaining gate structure 130'. Moreover, the sacrificial dielectric layer 148 of the HJFET gate structure 140 is etched. This may create a gap region 184 over the remaining gate structure 140'.

In the semiconductor device process formation described in FIGS. 17-20, only three (3) number of masks are necessary, no ion-implantations are necessary, and the maximum process temperature is, e.g., 100-200° C. Moreover, the semiconductor device process formation described in FIGS. 17-20 illustrate the integration of depletion mode MOSFETs and HJFETs, where at least one layer of each of the gate structures includes a metal layer, and where the semiconductor material includes gap regions for receiving $n^+$ c-Si:H layers and silicide.

Figure 21:
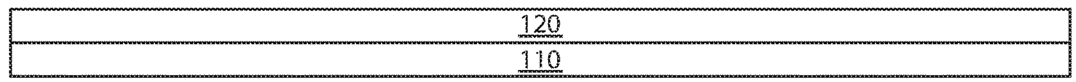
FIG. 21 is a cross-sectional view of an insulating substrate having a semiconductor material located thereon for forming an integrated depletion-mode MOSFET and HJFET semiconductor device, in accordance with an embodiment of the present disclosure.

FIG. 21 is a cross-sectional view of an insulating substrate having a semiconductor material located thereon for forming an integrated depletion-mode MOSFET and HJFET semiconductor device, in accordance with an embodiment of the present disclosure.

In one example, a semiconductor material 120 can be positioned directly over an insulating substrate or buried insulator 110. The semiconductor material 120 can be, e.g., an n-type Si semiconductor material layer. The semiconductor material 120 can be mono-crystalline or poly-crystalline. In one embodiment, the starting material is low-temperature poly-silicon (LTPS), but the process is applicable to other forms of poly-Si, mono-Si, or other semiconductors, such as mono/poly Ge, SiGe, III-V.

Figure 22:
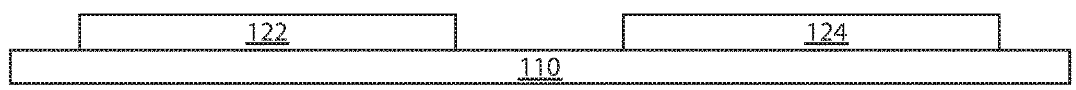
FIG. 22 is a cross-sectional view of the semiconductor device of FIG. 21 where the semiconductor material has been modified by photo-masking, in accordance with an embodiment of the present disclosure.

FIG. 22 is a cross-sectional view of the semiconductor device of FIG. 21 where the semiconductor material has been modified by photo-masking, in accordance with an embodiment of the present disclosure.

The semiconductor material 120 has been split or divided into two portions or sections, a first semiconductor material section 122 and a second semiconductor material section 124. The first and second semiconductor sections 122, 124 can be formed by, e.g., photo-masking. This process was described above with reference to FIGS. 2 and 10. In the instant case, a photo-mask (not shown) may create first and second semiconductor material sections 122, 124 on the insulating substrate 110. The first and second semiconductor material sections 122, 124 can be, e.g., n-type materials.

Figure 23:
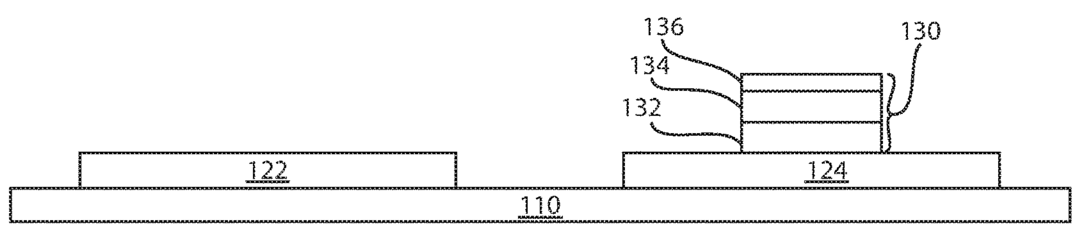
FIG. 23 is a cross-sectional view of the semiconductor device of FIG. 22 where a MOSFET gate structure is formed on a portion of the semiconductor material, the MOSFET gate structure including a metal layer, in accordance with an embodiment of the present disclosure.

FIG. 23 is a cross-sectional view of the semiconductor device of FIG. 22 where a MOSFET gate structure is formed on a portion of the semiconductor material, the MOSFET gate structure including a metal layer, in accordance with an embodiment of the present disclosure.

A depletion-mode MOSFET gate structure 130 is formed on the second semiconductor material section 124. The MOSFET gate structure 130 includes a dielectric layer 132, a metal layer 134, and a sacrificial dielectric layer 136.

Figure 24:
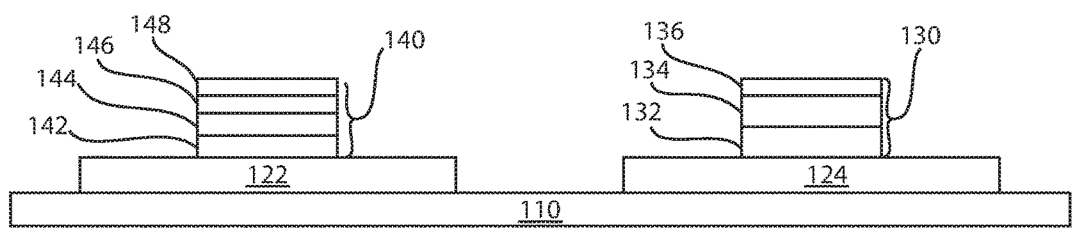
FIG. 24 is a cross-sectional view of the semiconductor device of FIG. 23 where a HJFET gate structure is formed on a portion of the semiconductor material, the HJFET gate structure including a metal layer, in accordance with an embodiment of the present disclosure.

FIG. 24 is a cross-sectional view of a semiconductor device of FIG. 23 where a HJFET gate structure is formed on a portion of the semiconductor material, the HJFET gate structure including a metal layer, in accordance with an embodiment of the present disclosure.

A HJFET gate structure 140 is formed on the first semiconductor material section 122. The HJFET gate structure 140 includes an intrinsic a-Si:H layer 142, a doped a-Si:H layer 144, a metal layer 146, and a sacrificial dielectric layer 148. The doped a-Si:H layer 144 can be, e.g., a p-type doped layer. The dopant type of the doped a-Si:H layer 144 can be opposite the dopant type of the first semiconductor material section 122. Thus, both a HJFET gate structure and a MOSFET gate structure are formed on a single insulating substrate 110.

Figure 25:
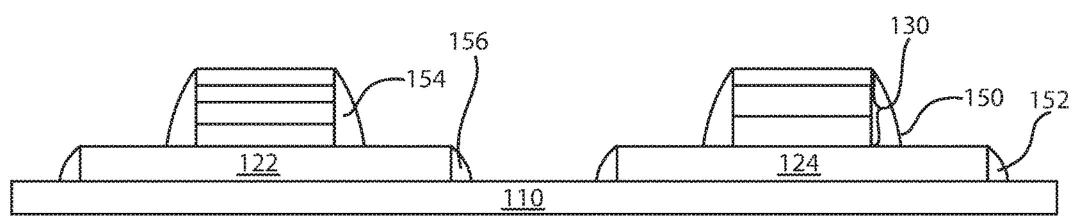
FIG. 25 is a cross-sectional view of the semiconductor device of FIG. 24 after spacer formation, in accordance with an embodiment of the present disclosure.

FIG. 25 is a cross-sectional view of a semiconductor device of FIG. 24 after spacer formation, in accordance with an embodiment of the present disclosure.

After spacer formation, the MOSFET gate structure 130 has spacer sidewalls 150 and the second semiconductor material 124 has spacer sidewalls 152. The HJFET gate structure 140 has spacer sidewalls 154 and the first semiconductor material 122 has spacer sidewalls 156. The spacer material is chosen to have a much lower etch rate in a wet chemical solution, such as buffer HF, than the sacrificial top dielectric layers 136, 148 used in the MOSFET and HJFET gate stacks 130, 140, respectively. In one example, the spacer is comprised of a high-k dielectric formed by atomic layer deposition whereas the sacrificial dielectrics 136, 148 are comprised of high-OH oxide deposited by PECVD at low plasma power density.

Figure 26:
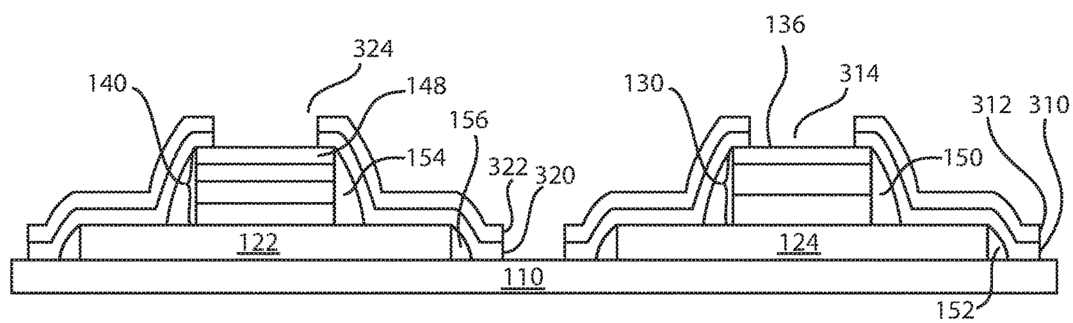
FIG. 26 is a cross-sectional view of the semiconductor device of FIG. 25 where crystalline hydrogenated silicon has been grown on portions of the depletion-mode MOSFET and the HJFET, and a metal layer is directly positioned on the crystalline hydrogenated silicon, in accordance with an embodiment of the present disclosure.

FIG. 26 is a cross-sectional view of a semiconductor device of FIG. 25 where crystalline hydrogenated silicon has been grown on portions of the depletion-mode MOSFET and the HJFET, and a metal layer is directly positioned on the crystalline hydrogenated silicon, in accordance with an embodiment of the present disclosure.

A c-Si:H layer 310 and a metal layer 312 are formed over a portion of the MOSFET gate structure 130 such that the layers 310, 312 extend over the second semiconductor material section 124, over the spacers 150, 152, and over a portion of the sacrificial layer 136. Thus, a portion of the sacrificial layer 136 is exposed. The layer 310 can be, e.g., an $n^+$ c-Si:H layer.

Similarly, an c-Si:H layer 320 and a metal layer 322 are formed over a portion of the HJFET gate structure 140 such that the layers 320, 322 extend over the first semiconductor material section 122, over the spacers 154, 156, and over a portion of the sacrificial layer 148. A portion of the sacrificial layer 148 is exposed. The layer 320 can be, e.g., an $n^+$ c-Si:H layer. A gap region 314 is also formed over the MOSFET gate structure 130 and a gap region 324 is also formed over the HJFET gate structure 140. The gap region 314 has a thickness approximately equal to the thickness of the layers 310, 312 and the gap region 324 has a thickness approximately equal to the thickness of the layers 320, 322. Moreover, the layers 310, 312, 320, 322 have, e.g., an asymmetrical shape when formed over their respective MOSFET and HJFET structures.

Figure 27:
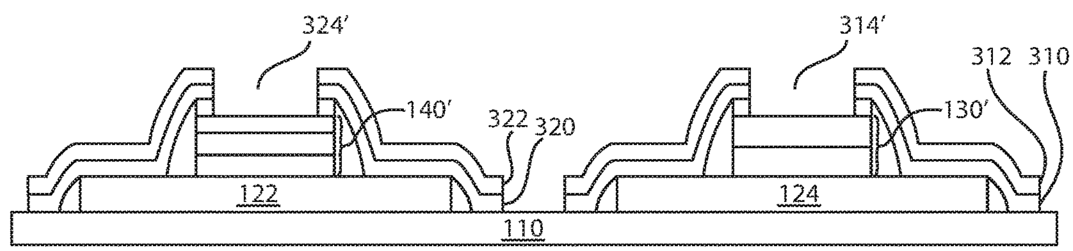
FIG. 27 is a cross-sectional view of the semiconductor device of FIG. 26 where sacrificial dielectrics are removed by etching to expose the metal layers of the depletion-mode MOSFET and the HJFET gate structures, in accordance with an embodiment of the present disclosure.

FIG. 27 is a cross-sectional view of a semiconductor device of FIG. 26 where sacrificial dielectrics are removed by etching to expose the metal layers of the depletion-mode MOSFET and the HJFET gate structures, in accordance with an embodiment of the present disclosure.

The sacrificial dielectric layer 136 of the MOSFET gate structure 130 is etched, thus creating a gap region 314' over the remaining gate structure 130'. Moreover, the sacrificial dielectric layer 148 of the HJFET gate structure 140 is etched, thus creating a gap region 324' over the remaining gate structure 140'.

In the semiconductor device process formation described in FIGS. 21-27, only four (4) number of masks are necessary, no ion-implantations are necessary, and the maximum process temperature is, e.g., 100-200° C. Moreover, the semiconductor device process formation described in FIGS. 21-27 illustrate the integration of depletion mode MOSFETs and HJFETs, where the gate structures are overlaid with overlapping c-Si:H and metal layers.

Figure 28:
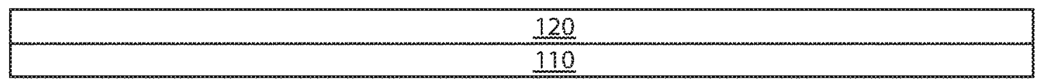
FIG. 28 is a cross-sectional view of an insulating substrate having a semiconductor material located thereon for forming an integrated depletion-mode MOSFET and HJFET semiconductor device, in accordance with an embodiment of the present disclosure.

FIG. 28 is a cross-sectional view of an insulating substrate having a semiconductor material located thereon for forming an integrated depletion-mode MOSFET and HJFET semiconductor device, in accordance with an embodiment of the present disclosure.

In one example, a semiconductor material 120 can be positioned directly over an insulating substrate or buried insulator 110. The semiconductor material 120 can be, e.g., an n-type Si semiconductor material layer. The semiconductor material 120 can be mono-crystalline or poly-crystalline. In one embodiment, the starting material is low-temperature poly-silicon (LTPS), but the process is applicable to other forms of poly-Si, mono-Si, or other semiconductors, such as mono/poly Ge, SiGe, III-V.

Figure 29:
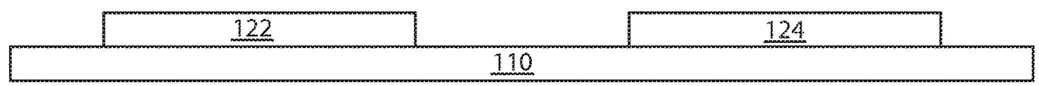
FIG. 29 is a cross-sectional view of the semiconductor device of FIG. 28 where the semiconductor material has been modified by photo-masking, in accordance with an embodiment of the present disclosure.

FIG. 29 is a cross-sectional view of the semiconductor device of FIG. 28 where the semiconductor material has been modified by photo-masking, in accordance with an embodiment of the present disclosure.

The semiconductor material 120 has been split or divided into two portions or sections, a first semiconductor material section 122 and a second semiconductor material section 124. The first and second semiconductor sections 122, 124 can be formed by, e.g., photo-masking. This process was described above with reference to FIGS. 2 and 10. In the instant case, a photo-mask (not shown) may create first and second semiconductor material sections 122, 124 on the insulating substrate 110. The first and second semiconductor material sections 122, 124 can be, e.g., n-type materials.

Figure 30:
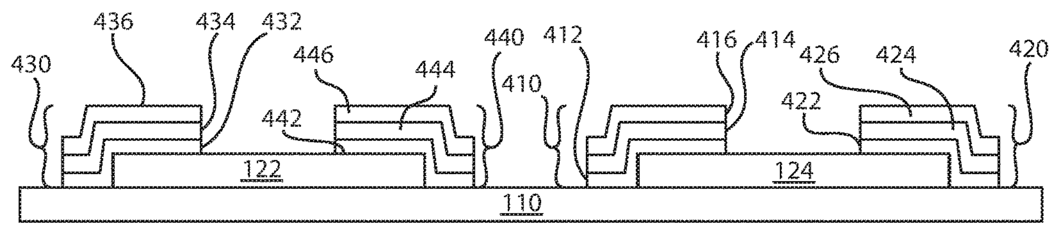
FIG. 30 is a cross-sectional view of the semiconductor device of FIG. 29 where source and drain contacts are formed for the depletion-mode MOSFET and HJFET semiconductor devices, in accordance with an embodiment of the present disclosure.

FIG. 30 is a cross-sectional view of the semiconductor device of FIG. 29 where source and drain contacts are formed for the depletion-mode MOSFET and HJFET semiconductor devices, in accordance with an embodiment of the present disclosure.

The MOSFET structure has a source contact 410 and a drain contact 420 formed thereon. The source contact 410 consists of three layers, a c-Si:H layer 412, a metal layer 414, and a sacrificial dielectric layer 416. Layer 412 may be an $n^+$ c-Si:H layer. Similarly, the drain contact 420 consists of three layers, a c-Si:H layer 422, a metal layer 424, and a sacrificial dielectric layer 426. Layer 422 may be an $n^+$ c-Si:H layer. The source contact 410 is formed on one end of the second semiconductor material section 124 and the drain contact 420 is formed on an opposite end of the second semiconductor material section 124.

The HJFET structure has a source contact 430 and a drain contact 440 formed thereon. The source contact 430 consists of three layers, a c-Si:H layer 432, a metal layer 434, and a sacrificial dielectric layer 436. Layer 432 may be an $n^+$ c-Si:H layer. Similarly, the drain contact 440 consists of three layers, a c-Si:H layer 442, a metal layer 444, and a sacrificial dielectric layer 446. Layer 442 may be an $n^+$ c-Si:H layer. The source contact 430 is formed on one end of the first semiconductor material section 122 and the drain contact 440 is formed on an opposite end of the first semiconductor material section 122.

Figure 31:
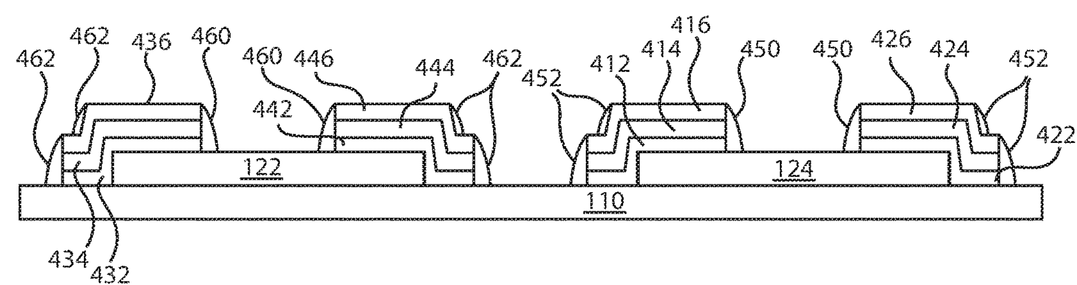
FIG. 31 is a cross-sectional view of the semiconductor device of FIG. 30 after spacer formation, in accordance with an embodiment of the present disclosure.

FIG. 31 is a cross-sectional view of the semiconductor device of FIG. 30 after spacer formation, in accordance with an embodiment of the present disclosure.

After spacer formation, the source contact 410 of the MOSFET structure has inner spacer sidewalls 450 and outer spacer sidewalls 452. The drain contact 420 of the MOSFET structure also has inner spacer sidewalls 450 and outer spacer sidewalls 452. The source contact 430 of the HJFET structure has inner spacer sidewalls 460 and outer spacer sidewalls 462. The drain contact 440 of the HJFET structure also has inner spacer sidewalls 460 and outer spacer sidewalls 462. The spacer material is chosen to have a much lower etch rate in a wet chemical solution, such as buffer HF, than the sacrificial dielectric layers 416, 426 used in the MOSFET structure and the sacrificial dielectric layers 436, 446 used in the HJFET gate structure.

Figure 32:
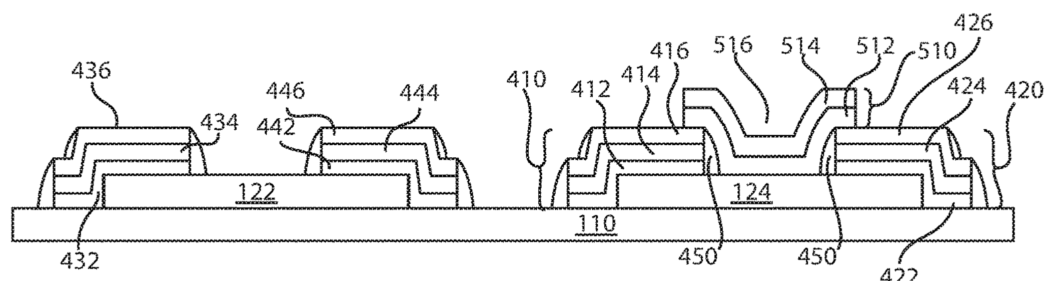
FIG. 32 is a cross-sectional view of the semiconductor device of FIG. 31 where the gate structure of the depletion-mode MOSFET is formed, in accordance with an embodiment of the present disclosure.

FIG. 32 is a cross-sectional view of the semiconductor device of FIG. 31 where the gate structure of the depletion-mode MOSFET is formed, in accordance with an embodiment of the present disclosure.

The gate structure 510 is formed between the source contact 410 and the drain contact 420 of the MOSFET structure. The gate structure 510 includes a dielectric layer 512 and a metal layer 514. The gate structure 510 forms a substantially U-shaped configuration when positioned between the source and drain contacts 410, 420. The gate structure 510 includes a gap 516. The gap 516 is formed as the edges of the gate structure 510 rest on the edges of the source and drain contacts 410, 420. Only a portion of the gate structure 510 extends onto the source and drain contacts 410, 420. The gate structure 510 extends over the inner spacer sidewalls 450, such that the inner spacer sidewalls are sandwiched between the source contact 410 and the gate structure 510, and sandwiched between the drain contact 420 and the gate structure 510.

Figure 33:
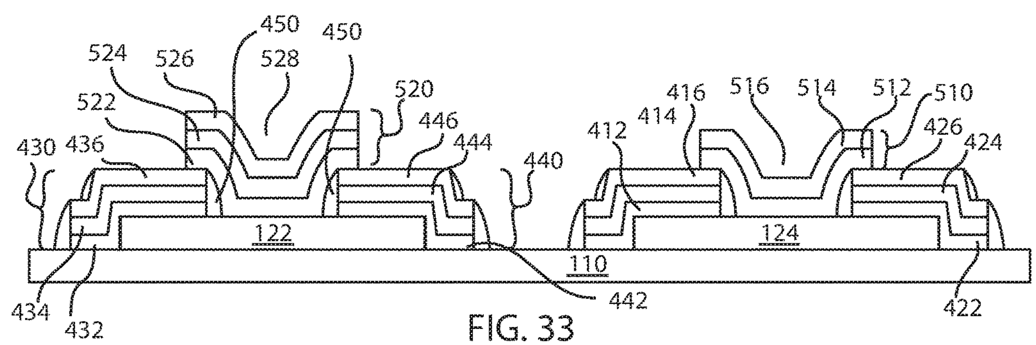
FIG. 33 is a cross-sectional view of the semiconductor device of FIG. 32 where the gate structure of the HJFET is formed, in accordance with an embodiment of the present disclosure.

FIG. 33 is a cross-sectional view of the semiconductor device of FIG. 32 where the gate structure of the HJFET is formed, in accordance with an embodiment of the present disclosure.

The gate structure 520 is formed between the source contact 430 and the drain contact 440 of the HJFET structure. The gate structure 520 includes an intrinsic a-Si:H layer 522, a doped a-Si:H layer 524, and a metal layer 526. Layer 524 may be a p-type layer. The gate structure 520 forms a substantially U-shaped configuration when positioned between the source and drain contacts 430, 440. The gate structure 520 includes a gap 528. The gap 528 is formed as the edges of the gate structure 520 rest on the edges of the source and drain contacts 430, 440. Only a portion of the gate structure 520 extends onto the source and drain contacts 430, 440. The gate structure 520 extends over the inner spacer sidewalls 450, such that the inner spacer sidewalls are sandwiched between the source contact 430 and the gate structure 520, and sandwiched between the drain contact 440 and the gate structure 520.

Figure 34:
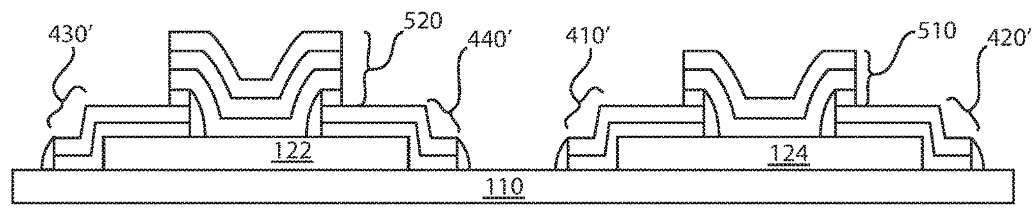
FIG. 34 is a cross-sectional view of the semiconductor device of FIG. 33 where sacrificial dielectrics are removed by etching to expose the metal layers of the depletion-mode MOSFET and the HJFET gate structures, in accordance with an embodiment of the present disclosure.

FIG. 34 is a cross-sectional view of the semiconductor device of FIG. 33 where sacrificial dielectrics are removed by etching to expose the metal layers of the depletion-mode MOSFET and the HJFET gate structures, in accordance with an embodiment of the present disclosure.

The sacrificial dielectric layers 416, 426 of the source and drain contacts 410, 420 of the MOSFET structure are etched, thus creating a remaining source contact 410' and a remaining drain contact 420'. Moreover, the sacrificial dielectric layers 436, 446 of the source and drain contacts 430, 440 of the HJFET structure are etched, thus creating a remaining source contact 430' and a remaining drain contact 440'.

In the semiconductor device process formation described in FIGS. 28-34, only four (4) number of masks are necessary, no ion-implantations are necessary, and the maximum process temperature is, e.g., 100-200° C. Moreover, the semiconductor device process formation described in FIGS. 28-34 illustrate the integration of depletion mode MOSFETs and HJFETs, where the source and drain contacts are formed first, and then the gate structures are formed such that the gate structures are embedded between the source and drain contacts.

Figure 35:
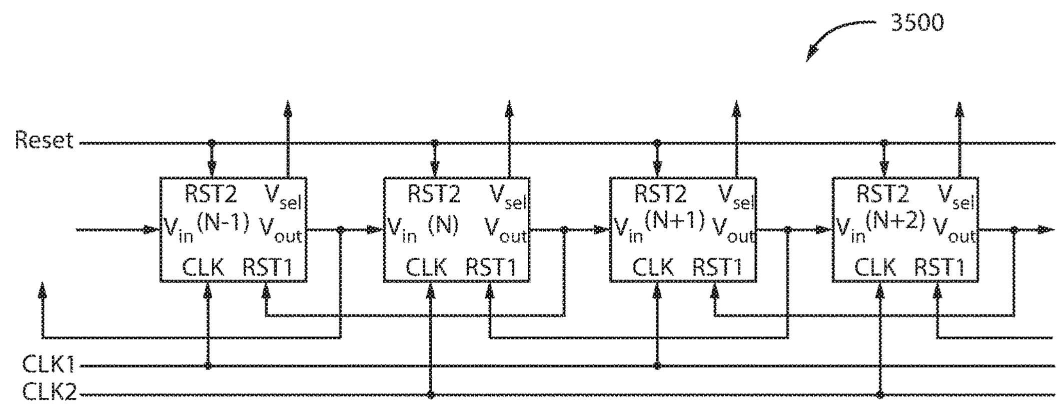
FIG. 35 is a shift register, in accordance with an embodiment of the present disclosure.
Figure 36:
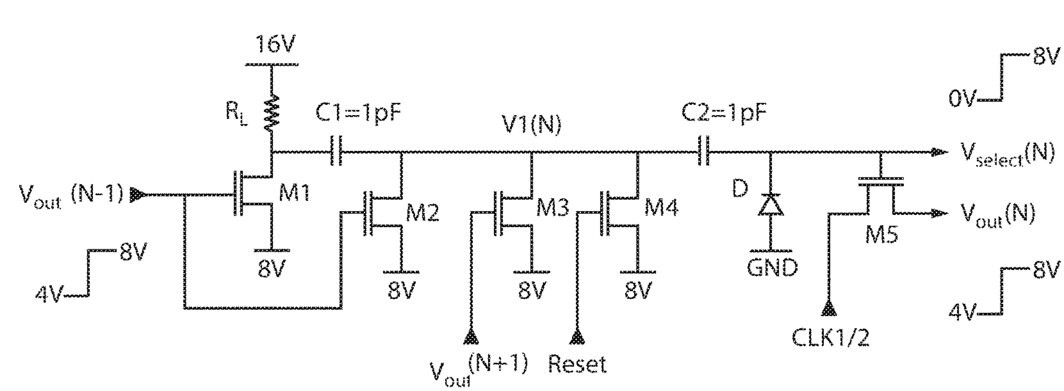
FIG. 36 is a circuit of the shift register of FIG. 35, in accordance with an embodiment of the present disclosure.

FIG. 35 is a shift register 3500, in accordance with an embodiment of the present disclosure. FIG. 36 is a circuit 3600 of the shift register 3500 of FIG. 35, in accordance with an embodiment of the present disclosure.

Shift register 3500 includes input transistors (M1, M2), an integrating resistor (RL) and capacitor, resetting transistors (M3, M4), a level shifting capacitor and diode (C2, D), and a pass transistor (M5) driven by a two-stage (odd/even) clock. All transistors are depletion-mode fabricated.

A capacitor can be implemented by using the gate terminal of a depletion mode MOSFET as the first terminal of the capacitor, and using either or both the drain and source of the depletion mode transistor as the second terminal of the capacitor. When both the drain and source terminals are used, they may be electrically connected to each other to form a single terminal. However, a capacitor also can be formed monolithically from two (2) metal layers and at least one dielectric layer (i.e., an MIM capacitor), which may also include one or more layers of a doped semiconductor (e.g., a-Si:H). A diode may be implemented by using the gate terminal of an HJFET as the first terminal of the diode, and using either or both the drain and source terminals of the HJFET as the second terminal of the diode. When both the drain and source terminals are used, they may be electrically connected to each other to form a single terminal.

An integrating resistor can be implemented from a geometrically patterned portion of the semiconductor substrate. For example, a patterned rectangle having a length of L, width of W and thickness of t, will have a resistance of $\rho L/(w \cdot t)$, where p is the substrate resistivity. An integrating resistor can also be implemented by applying a constant bias to the gate of an HJFET or a depletion-mode MOSFET.

In the exemplary circuit of FIG. 36 which illustrates the N-th stage of the disclosed shift register, the odd/even clocks (CLK 1/2) and the reset voltage (Reset) are voltage pulses in the range of 4-8V. The input voltage ($V_{in}(N)=V_{out}(N-1)$) and the output voltage ($V_{out}(N)=V_{in}(N+1)$) are voltage pulses in the range of approximately 4-8V, the voltage of the internal node $V_1(N)$ (the drain voltage of M2, M3 and M4) is in the range of approximately 8-16V, and the drive voltage routed to the N-th row of the active-matrix ($V_{select}(N)$) is in the range of approximately 0-8V. The integrating resistor $R_L$ consumes power only when the N-th stage is active (i.e., when $V_{in}(N)=V_{out}(N)=V_{select}(N)=\sim 8V$). This power consumption (approximately $(16V-8V)^2/R_L$) can be reduced by choosing a large $R_L$; however, the operation speed of the shift register is affected by the $R_L \cdot C1$ delay, therefore imposing an upper limit on the value of $R_L$. In one example, for a row-time of ~1 μs, a suitable value for $R_L$ may be ~250KΩ. In another example, for a row time of ~0.1 μs, a suitable value for $R_L$ may be ~25KΩ.

In the exemplary diagram and circuit of FIGS. 35 and 36, the output of the (N+1)-th stage, $V_{out}(N+1)$, is used to reset the N-th stage. In other embodiments, the row drive voltage generated by the (N+1)-th stage, $V_{select}$ (N+1), may be used for resetting the N-th stage instead of $V_{out}$ (N+1). If overlapping clock signals are used, both $V_{out}(N+1)$ or $V_{select}(N+1)$ may be used for generating substantially synchronized row drive voltages (i.e., rise of $V_{select}(N+1)$ being substantially synchronized with the fall of $V_{select}(N)$). However, if non-overlapping clocks are used, $V_{select}(N+1)$ must be used for resetting the N-th stage so that the rise of $V_{select}(N+1)$ triggers the fall of $V_{select}(N)$, resulting in synchronized row drive voltages.

Figure 37:
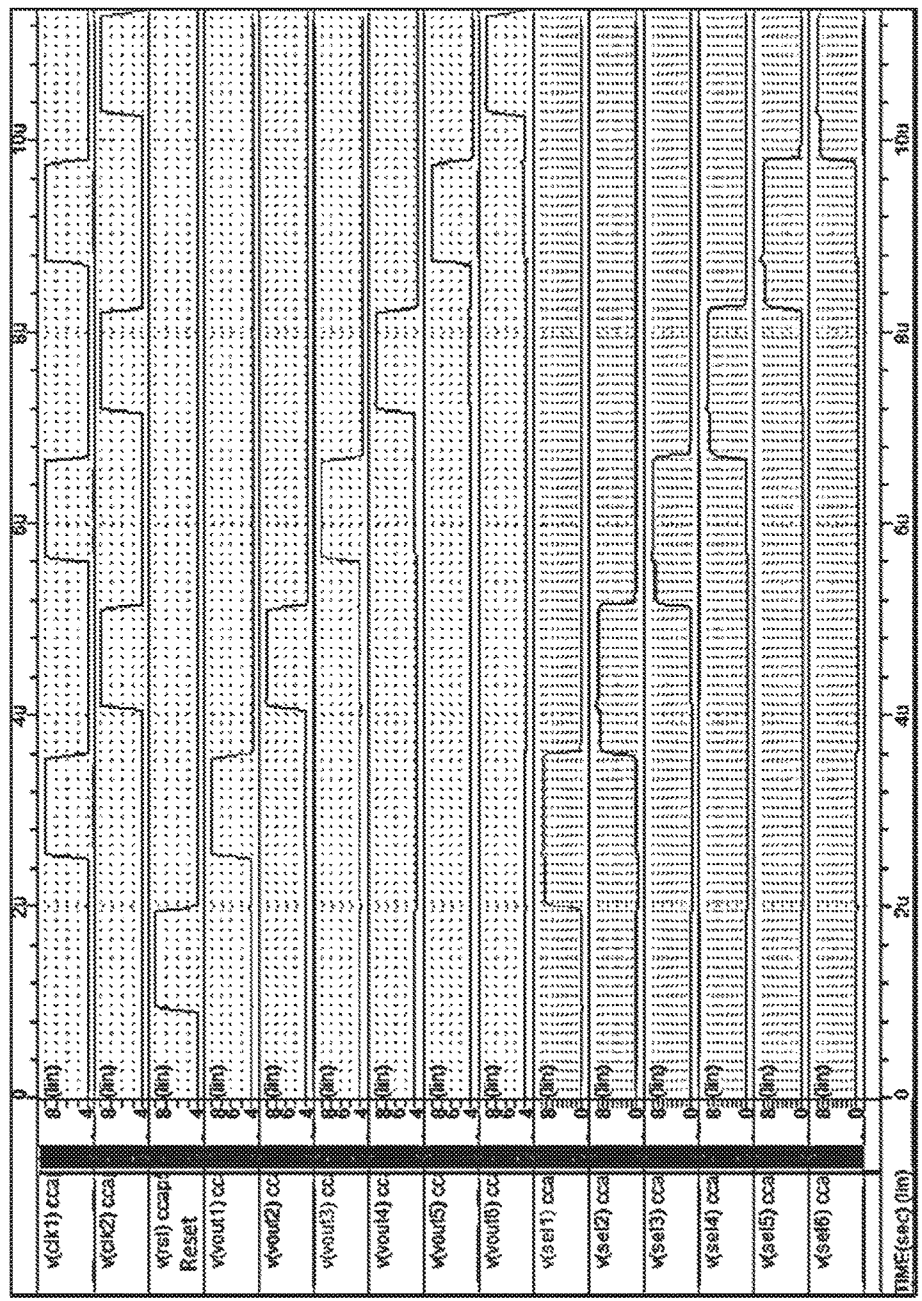
FIG. 37 depicts an example simulation of a 6-stage shift register with non-overlapping clocks, and $R_L$=200KΩ and C=1 pF, in accordance with an embodiment of the present disclosure.

FIG. 37 depicts an example simulation 3700 of a 6-stage shift register with non-overlapping clocks, and $R_L$=200KΩ and C=1 pF, in accordance with an embodiment of the present disclosure. The simulated n-channel depletion mode transistors have a channel width-to-length ratio (W/L) of 5, threshold voltage of −3.25V, gate oxide thickness of 50 nm, and channel sheet resistance of approximately 30 KΩ/□ at gate-to-source voltage ($V_{GS}$) of 0V and drain-to-source voltage ($V_{DS}$) of 0.1V. The channel sheet resistance can be obtained, e.g., by doping a 50 nm-thick LTPS channel to a donor concentration ($N_D$) of approximately $5\times10^{17}$ cm$^{-3}$. The output of the (N+1)-th stage, $V_{out}(N+1)$, is used to reset the N-th stage, as in the exemplary diagram and circuit of FIGS. 35 and 36.

Figure 38:
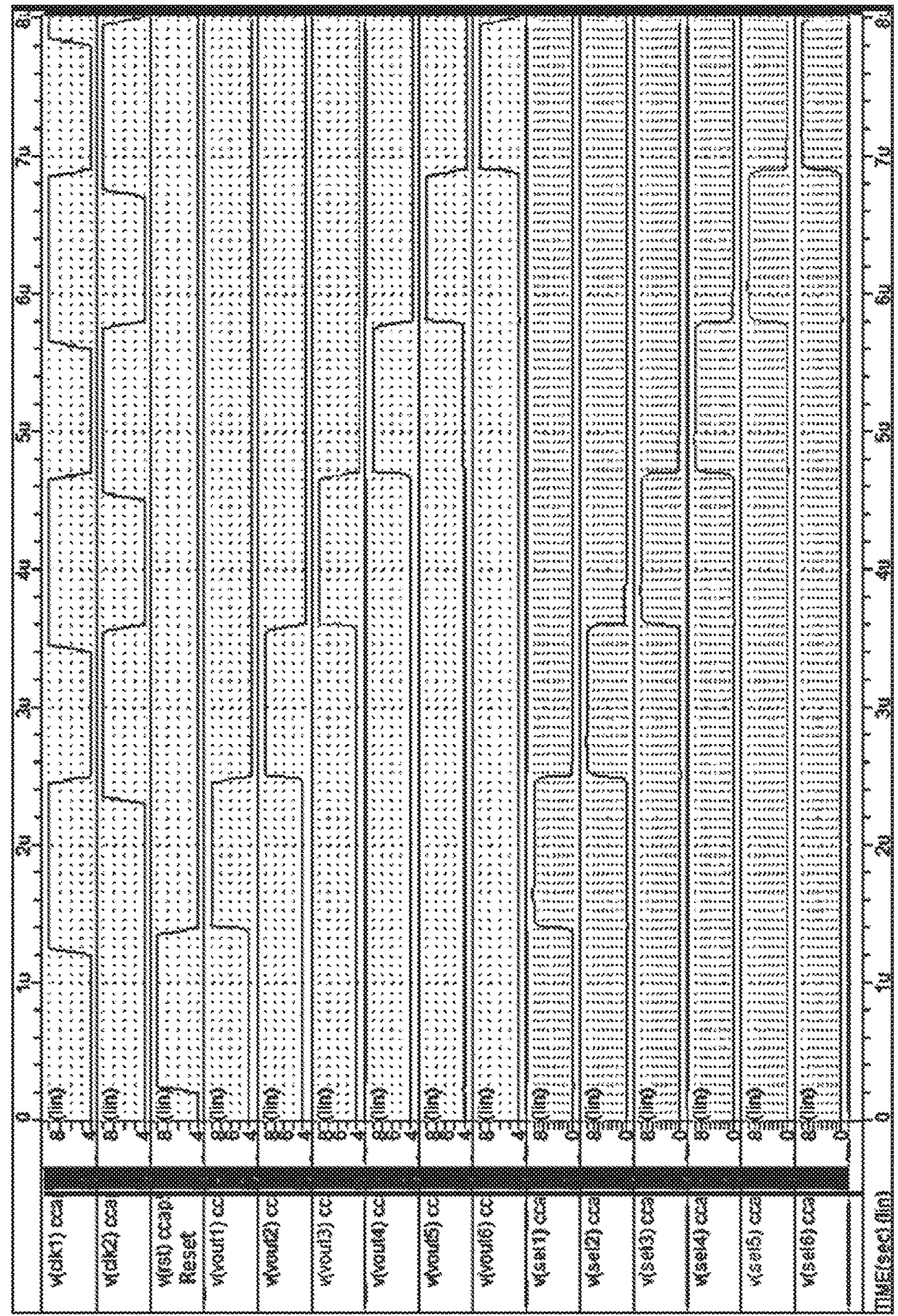
FIG. 38 depicts an example simulation of a 6-stage shift register with overlapping clocks, and $R_L$=250KΩ and C=1 pF, in accordance with an embodiment of the present disclosure.

FIG. 38 depicts an example simulation 3800 of a 6-stage shift register with overlapping clocks, and $R_L$=250KΩ and C=1 pF, in accordance with an embodiment of the present disclosure. The depletion-mode n-channel transistors used for simulations have the same specifications as explained for the example simulation 3700 of FIG. 37. The row drive voltage generated by the (N+1)-th stage, $V_{select}$ (N+1), is used for resetting the N-th stage.

Concerning FIGS. 37 and 38, in practice, the generated row drive voltages may have small overlaps due to the stage delays. It should be appreciated by those skilled in the art that shift register stages can be configured with connections different from what is described above and/or used in applications other than active matrix displays. For example, if $V_{select}$ (N+2) is used to reset the N-th stage, the generated $V_{select}$ voltages are overlapping pulses having pulse durations approximately twice as that of the clock pulse duration and having overlap durations of approximately the same as that of the clock pulse duration.

Multiple voltage levels (e.g., 16V, 8V and 4V used in the exemplary circuit of FIG. 36) can be implemented from a single source (e.g., a single 4V source for the exemplary circuit of FIG. 36), e.g., by using charge pumps. The diodes and capacitors used in the charge pump can be implemented using the approaches explained above. Clocks and other control signals can be generated from a chip (e.g., a row driver chip) and level shifted with diodes and capacitors.

Figure 39:
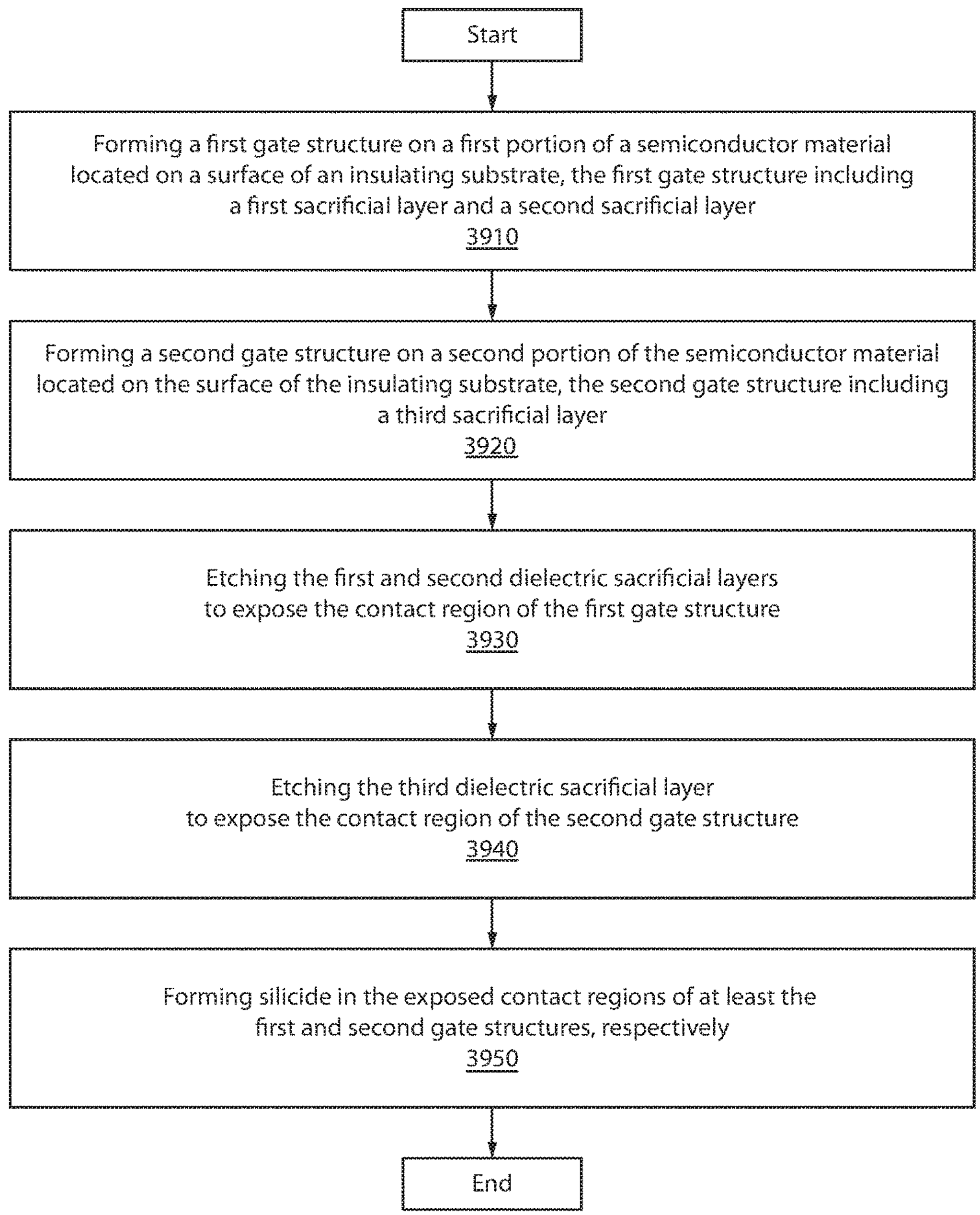
FIG. 39 is a block/flow diagram of an exemplary method for forming a semiconductor device, in accordance with an embodiment of the present disclosure.

FIG. 39 is a block/flow diagram of an exemplary method for forming a semiconductor device, in accordance with an embodiment of the present disclosure.

At block 3910, a first gate structure is formed on a first portion of a semiconductor material located on a surface of an insulating substrate, the first gate structure including a first sacrificial layer and a second sacrificial layer.

At block 3920, a second gate structure is formed on a second portion of the semiconductor material located on the surface of the insulating substrate, the second gate structure including a third sacrificial layer.

At block 3930, the first and second dielectric sacrificial layers are etched to expose the contact region of the first gate structure.

At block 3940, the third dielectric sacrificial layer is etched to expose the contact region of the second gate structure.

At block 3950, silicide is formed in the exposed contact regions of at least the first and second gate structures, respectively.

Figure 40:
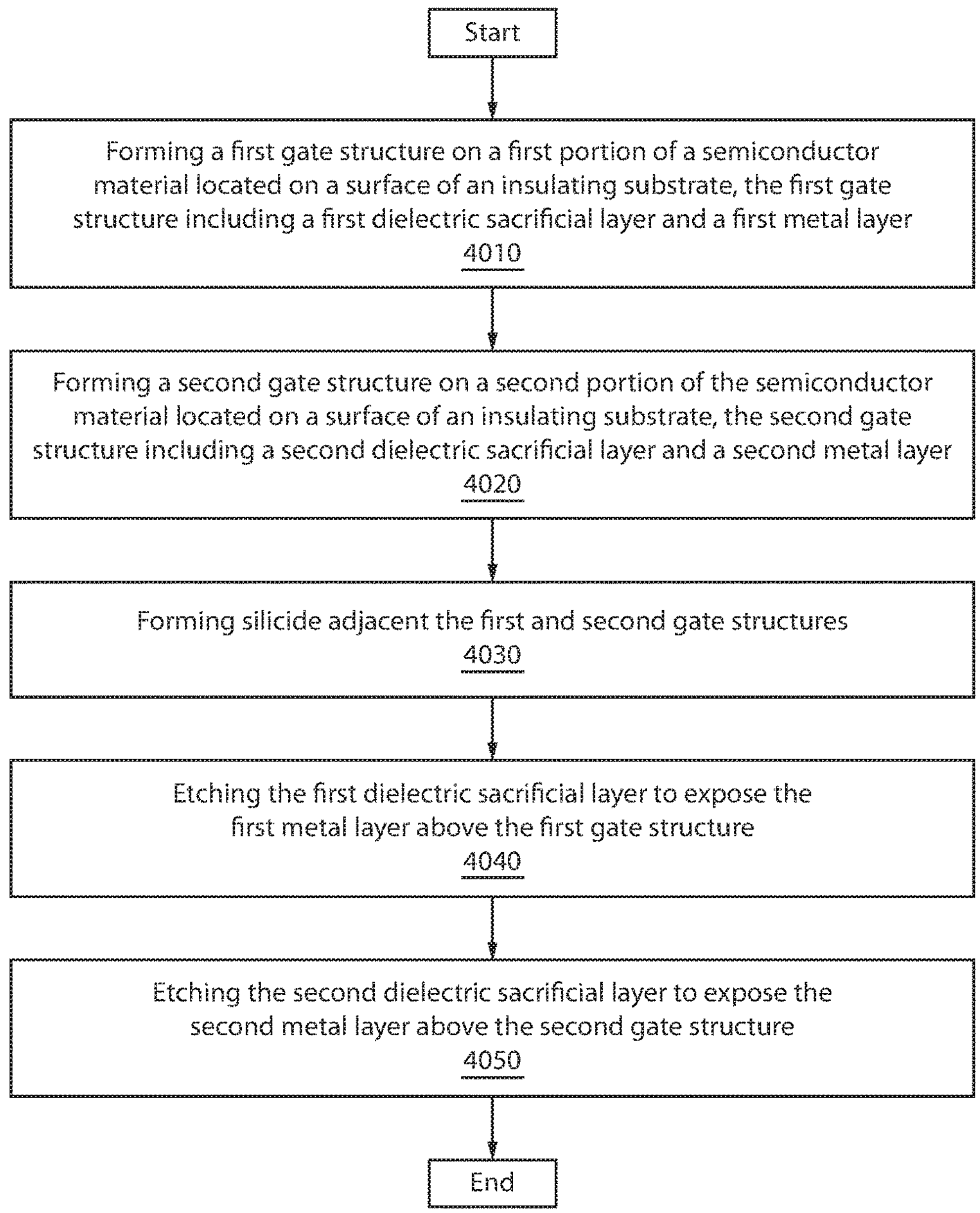
FIG. 40 is a block/flow diagram of an exemplary method for forming a semiconductor device having gate structures with metal layers, in accordance with an embodiment of the present disclosure.

FIG. 40 is a block/flow diagram of an exemplary method for forming a semiconductor device having gate structures with metal layers, in accordance with an embodiment of the present disclosure.

At block 4010, a first gate structure is formed on a first portion of a semiconductor material located on a surface of an insulating substrate, the first gate structure including a first dielectric sacrificial layer and a first metal layer.

At block 4020, a second gate structure is formed on a second portion of the semiconductor material located on the surface of the insulating substrate, the second gate structure including a second dielectric sacrificial layer and a second metal layer.

At block 4030, silicide is formed adjacent the first and second gate structures.

At block 4040, the first dielectric sacrificial layer is etched to expose the first metal layer above the first gate structure.

At block 4050, the second dielectric sacrificial layer is etched to expose the second metal layer above the second gate structure.

It is to be understood that the present invention will be described in terms of a given illustrative architecture; however, other architectures, structures, substrate materials and process features and steps/blocks may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present embodiments. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:

a semiconductor material located on a surface of an insulating substrate;

a first gate structure formed on a portion of the semiconductor material, the first gate structure including a first sacrificial layer and a hydrogenated amorphous silicon layer; and a second gate structure formed on a portion of the semiconductor material, the second gate structure including an intrinsic layer, a doped layer, and a second sacrificial layer, the intrinsic layer directly contacting the second portion of the semiconductor material;

wherein the first and second sacrificial layers of the first and second gate structures are etched to create first and second contact regions within the first and second gate structures, respectively, for receiving silicide.

2. The semiconductor device of claim 1, wherein the first gate structure is a depletion-mode metal oxide semiconductor field effect transistor (MOSFET) and the second gate structure is a heterojunction field effect transistor (HJFET).

3. The semiconductor device of claim 1, wherein the semiconductor material located on the surface of the insulating substrate is a LTPS (low-temperature poly-silicon) material.

4. The semiconductor device of claim 1, wherein the first and second sacrificial layers are dielectric layers.

5. The semiconductor device of claim 1, wherein the doped layer of the second gate structure has a dopant type opposite a dopant type of the second portion of the semiconductor material.

6. The semiconductor device of claim 5, wherein hydrogenated silicon is grown before etching of the first sacrificial layer of the first gate structure and the second sacrificial layer of the second gate structure.

7. The semiconductor device of claim 6, wherein, after etching, hydrogenated silicon remains adjacent the first and second gate structures.

8. The semiconductor device of claim 7, wherein the hydrogenated silicon has a second dopant type, the second dopant type being opposite the first dopant type of the second gate structure.

9. The semiconductor device of claim 1, wherein the first gate structure is formed between a first set of spacers and the second gate structure is formed between a second set of spacers.

10. The semiconductor device of claim 9, wherein the first and second set of spacers extend beyond a top surface of the first and second gate structures, respectively.

11. A semiconductor device, comprising:

a first gate structure formed on a first portion of a semiconductor material located on a surface of an insulating substrate, the first gate structure including a first sacrificial layer and a first metal layer;

a second gate structure formed on a second portion of the semiconductor material located on the surface of the insulating substrate, the second gate structure including an intrinsic layer, a doped hydrogenated silicon layer, and a second sacrificial layer, the intrinsic layer directly contacting the second portion of the semiconductor material;

wherein the first and second sacrificial layers of the first and second gate structures are etched to create first and second contact regions within the first and second gate structures, respectively, for receiving silicide.

12. The semiconductor device of claim 11, wherein the first gate structure is a depletion-mode MOSFET and the second gate structure is a HJFET.

13. The semiconductor device of claim 11, wherein the semiconductor material located on the surface of the insulating substrate is a LTPS (low-temperature poly-silicon) material.

14. The semiconductor device of claim 11, wherein the doped layer of the second gate structure has a dopant type opposite a dopant type of the second portion of the semiconductor material.

15. The semiconductor device of claim 14, wherein hydrogenated silicon is grown before etching of the first and second sacrificial layers of the first and second gate structures, respectively.

16. The semiconductor device of claim 15, wherein, after etching, hydrogenated silicon remains adjacent the first and second gate structures.

17. The semiconductor device of claim 16, wherein the hydrogenated silicon has a second dopant type, the second dopant type being opposite the first dopant type of the second gate structure.

18. The semiconductor device of claim 11, wherein hydrogenated silicon is grown and a metal layer is placed over the hydrogenated silicon, the hydrogenated silicon and metal layer extending over the semiconductor material and onto a portion of the first and second gate structures.

19. The semiconductor device of claim 11, wherein the first gate structure is formed between a first set of spacers and the second gate structure is formed between a second set of spacers.

20. The semiconductor device of claim 19, wherein the first and second set of spacers extend beyond a top surface of the first and second gate structures, respectively.

* * * * *